United States Patent
Hobbs et al.

(10) Patent No.: US 10,792,658 B2
(45) Date of Patent: Oct. 6, 2020

(54) LATERAL/VERTICAL TRANSISTOR STRUCTURES AND PROCESS OF MAKING AND USING SAME

(71) Applicant: Berkeley Lights, Inc., Emeryville, CA (US)

(72) Inventors: Eric D. Hobbs, Livermore, CA (US); Justin K. Valley, Berkeley, CA (US)

(73) Assignee: Berkeley Lights, Inc., Emeryville, CA (US)

(*) Notice: Subject to any disclaimer, the term of this patent is extended or adjusted under 35 U.S.C. 154(b) by 0 days.

(21) Appl. No.: 16/509,414

(22) Filed: Jul. 11, 2019

(65) Prior Publication Data

US 2020/0078785 A1   Mar. 12, 2020

Related U.S. Application Data

(63) Continuation of application No. 15/912,164, filed on Mar. 5, 2018, now Pat. No. 10,350,594, which is a
(Continued)

(51) Int. Cl.
*G01N 15/06* (2006.01)
*B01L 3/00* (2006.01)
(Continued)

(52) U.S. Cl.
CPC ... *B01L 3/502715* (2013.01); *B01L 3/502761* (2013.01); *B03C 5/005* (2013.01);
(Continued)

(58) Field of Classification Search
CPC .......... G01N 15/06; G01N 25/18; B01L 3/00; B01L 3/502715; B01L 3/502761; B03C 5/005; H01L 21/00; H01L 21/331
See application file for complete search history.

(56) References Cited

U.S. PATENT DOCUMENTS

| | | |
|---|---|---|
| 6,294,063 B1 | 9/2001 | Becker et al. |
| 6,942,776 B2 | 9/2005 | Medoro |

(Continued)

FOREIGN PATENT DOCUMENTS

| | | |
|---|---|---|
| CN | 102360009 A | 2/2012 |
| CN | 103943778 B | 8/2016 |

(Continued)

OTHER PUBLICATIONS

First Examination Report for AU Patent Appln. No. 2019200127 dated Dec. 4, 2019 (3 pages).

(Continued)

*Primary Examiner* — Brian J. Sines
(74) *Attorney, Agent, or Firm* — Vista IP Law Group, LLP

(57) ABSTRACT

A microfluidic device can include a base an outer surface of which forms one or more enclosures for containing a fluidic medium. The base can include an array of individually controllable transistor structures each of which can comprise both a lateral transistor and a vertical transistor. The transistor structures can be light activated, and the lateral and vertical transistors can thus be photo transistors. Each transistor structure can be activated to create a temporary electrical connection from a region of the outer surface of the base (and thus fluidic medium in the enclosure) to a common electrical conductor. The temporary electrical connection can induce a localized electrokinetic force generally at the region, which can be sufficiently strong to move a nearby micro-object in the enclosure.

30 Claims, 14 Drawing Sheets

Related U.S. Application Data continuation of application No. 14/961,215, filed on Dec. 7, 2015, now Pat. No. 9,908,115.

(60) Provisional application No. 62/089,085, filed on Dec. 8, 2014.

(51) Int. Cl.
| | |
|---|---|
| *H01L 21/00* | (2006.01) |
| *G01N 25/18* | (2006.01) |
| *B03C 5/00* | (2006.01) |
| *B03C 5/02* | (2006.01) |
| *H01L 27/146* | (2006.01) |
| *H01L 29/732* | (2006.01) |

(52) U.S. Cl.
CPC ........ *B03C 5/026* (2013.01); *H01L 27/14681* (2013.01); *B01L 3/50273* (2013.01); *B01L 3/502707* (2013.01); *B01L 2200/0647* (2013.01); *B01L 2300/0816* (2013.01); *B01L 2300/0819* (2013.01); *B01L 2400/0415* (2013.01); *B01L 2400/0424* (2013.01); *H01L 29/732* (2013.01)

(56) References Cited

U.S. PATENT DOCUMENTS

| | | | |
|---|---|---|---|
| 6,977,033 | B2 | 12/2005 | Becker et al. |
| 7,090,759 | B1 | 8/2006 | Seul |
| 7,641,779 | B2 | 1/2010 | Becker et al. |
| 7,956,339 | B2 | 6/2011 | Ohta et al. |
| 8,581,167 | B2 | 11/2013 | Lean et al. |
| 9,144,806 | B2 | 9/2015 | Chen et al. |
| 9,625,409 | B1 | 4/2017 | Cai et al. |
| 9,726,631 | B1 | 8/2017 | Cai et al. |
| 9,908,115 | B2 * | 3/2018 | Hobbs .................... B03O 5/005 |
| 2002/0088712 | A1 | 7/2002 | Miles |
| 2003/0008364 | A1 | 1/2003 | Wang et al. |
| 2003/0157783 | A1 | 8/2003 | Fonash et al. |
| 2004/0191789 | A1 | 9/2004 | Manaresi et al. |
| 2004/0231987 | A1 | 11/2004 | Sterling et al. |
| 2005/0112548 | A1 | 5/2005 | Segawa et al. |
| 2005/0136419 | A1 * | 6/2005 | Lee ........................ B82Y 30/00 435/6.11 |
| 2005/0175981 | A1 | 8/2005 | Voldman et al. |
| 2006/0091015 | A1 | 5/2006 | Lau |
| 2007/0095669 | A1 | 5/2007 | Lau et al. |
| 2007/0202561 | A1 | 8/2007 | Rosenstein |
| 2008/0000635 | A1 | 1/2008 | Rioufol et al. |
| 2008/0006535 | A1 | 1/2008 | Paik et al. |
| 2008/0108122 | A1 | 5/2008 | Paul et al. |
| 2008/0171316 | A1 * | 7/2008 | Golovchenko .. G01N 27/44743 435/6.11 |
| 2008/0274513 | A1 | 11/2008 | Shenderov et al. |
| 2008/0302732 | A1 | 12/2008 | Soh et al. |
| 2009/0170186 | A1 | 7/2009 | Wu et al. |
| 2010/0101960 | A1 * | 4/2010 | Ohta ....................... B82Y 15/00 204/643 |
| 2010/0267158 | A1 * | 10/2010 | Chou ....................... C12Q 1/68 436/94 |
| 2010/0317132 | A1 | 12/2010 | Rogers et al. |
| 2011/0204455 | A1 | 8/2011 | Kang et al. |
| 2012/0118740 | A1 | 5/2012 | Garcia et al. |
| 2012/0325665 | A1 | 12/2012 | Chiou et al. |
| 2013/0118901 | A1 | 5/2013 | Pollack et al. |
| 2013/0118905 | A1 | 5/2013 | Morimoto et al. |
| 2013/0338956 | A1 | 12/2013 | Zieren et al. |
| 2014/0299472 | A1 | 10/2014 | Chang et al. |
| 2016/0153932 | A1 | 6/2016 | Eklund et al. |
| 2016/0193604 | A1 | 7/2016 | McFarland et al. |
| 2017/0021366 | A1 | 1/2017 | Chapman et al. |

FOREIGN PATENT DOCUMENTS

| | | |
|---|---|---|
| EP | 0137906 | 6/1984 |
| EP | 1646084 | 4/2006 |
| GB | 2330451 B | 11/2002 |
| JP | 2004193527 A | 7/2004 |
| JP | 2004340821 A | 12/2004 |
| JP | 2007003386 A | 1/2007 |
| JP | 2011506998 A | 3/2011 |
| TW | 200603379 A | 1/2006 |
| TW | I453399 B | 9/2014 |
| TW | 201525461 A | 7/2015 |
| WO | 2008/119066 | 10/2008 |
| WO | 2009146143 | 12/2009 |
| WO | 2010/147942 | 12/2010 |
| WO | 2014/074367 | 5/2014 |
| WO | 2015/164847 | 10/2015 |
| WO | 2015164846 | 10/2015 |

OTHER PUBLICATIONS

H. Y. Hsu, et al., "Sorting of Differentiated Neurons Using Phototransistor-Based Optoelectronic Tweezers for Cell Replacement Therapy of Neurodegenerative Diseases", Transducers 2009, Denver, CO USA Jun. 2009, copy download dated Nov. 23, 2009 from IEEE Xplore, 4 pages.

Valley et al., Optoelectronic Tweezers as a Tool for Parallel Single-Cell Manipulation and Stimulation, IEEE Transactions on Biomedical Circuits and Systems 3(6):424-30 (2009).

Xu, Guolin et al,. Recent Trends in Dielectrophoresis, Informacije MIDEM, 2010, vol. 40, Issue No. 4, pp. 253-262.

Valley et al., An Integrated Platform for Light-Induced Dielectro-Phoresis and Electrowetting, International Conference on Miniaturized Systems for Chemistry and Life Sciences (2010).

Chiou, Pei-Yu. Massively parallel optical manipulation of single cells, micro-and nano-particles on optoelectronic devices. Diss. University of California at Berkeley, 2005 (147 pages).

Chiou, P. Y., Ohta, A. T. & Wu, M. C., Massively parallel manipulation of single cells and micro particles using optical images. Nature 436, 370-372, Aug. 2005 (4 pages).

PCT International Search Report and Written Opinion for International Application No. PCT/US2015/064286, Applicant Berkeley Lights, Inc., Forms PCT/ISA/210, 220, and 237, dated Mar. 23, 2016 (17 pages).

Z Report_Examination Report for AU Application No. 2015360849 dated Dec. 8, 2017.

Z Report_Examination Report for AU Application No. 2015360849 dated Jul. 9, 2018.

Z Report_Response to Examiner's Report for AU Application No. 2015360849 dated Jun. 20, 2018.

\* cited by examiner

LATERAL/VERTICAL TRANSISTOR STRUCTURES AND PROCESS OF MAKING AND USING SAME

RELATED APPLICATION DATA

The present application is a continuation of U.S. patent application Ser. No. 15/912,164, filed Mar. 5, 2018, now U.S. Pat. No. 10,350,594, which is a continuation of U.S. patent application Ser. No. 14/961,215, filed Dec. 7, 2015, now U.S. Pat. No. 9,908,115, which claims the benefit under 35 U.S.C. § 119 to U.S. provisional patent application Ser. No. 62/089,085, filed Dec. 8, 2014. The foregoing applications are hereby incorporated by reference into the present application in their entirety.

FIELD

The present invention generally relates to microfluidic devices that include a substrate having an optically-actuated electrokinetic configuration and, in particular, an optically-actuated dielectrophoresis (DEP) configuration.

BACKGROUND

Microfluidic devices can be convenient platforms for processing micro-objects such as biological cells. Micro-objects in a microfluidic device can be selected and moved by selectively generating localized electrokinetic forces in the device. Embodiments of the inventions disclosed in the present application include improvements to generating electrokinetic forces in microfluidic devices.

SUMMARY

In some embodiments, a microfluidic device includes an enclosure having a microfluidic structure and a base, which can include a common electrical conductor. The microfluidic structure and an outer surface of the base together can define a flow path within the enclosure. The base can include an array of transistor structures each of which can comprise a lateral bipolar transistor connecting a corresponding region of the outer surface of the base to the common conductor. In some embodiments, the microfluidic device can be part of a system that includes control equipment for controlling operation of the microfluidic device.

In some embodiments, a method of moving a micro-object in a fluidic medium in a microfluidic device can include providing biasing power to the biasing electrode and the common electrical conductor of the base. The method can also include activating a first of the transistor structures at a first of the regions of the outer surface of the base, creating an eletrokinetic force in the vicinity of the activated first transistor structure sufficient to move a nearby micro-object in the flow path.

Accordingly, in one aspect, the invention provides microfluidic devices having an enclosure that includes a microfluidic structure and a base. The microfluidic structure and an outer surface of the base can together define a flow path within the enclosure. In certain embodiments, the base can include a common conductor and an array of transistor structures, each having a lateral bipolar transistor connecting a corresponding region of the outer surface of the base to the common conductor. Each transistor structure in the array can further have a vertical bipolar transistor connecting the corresponding region of the outer surface of the base.

Each transistor structure in the array can include an emitter region, a base region, and a collector region. In certain embodiments, the base region can surround the emitter region, and the collector region can surround the base region. Each transistor structure in the array can be physically separated from other transistor structures in the array. For example, the transistor structures in the array can be physically separated from other transistor structures in the array by a trench.

In certain embodiments, the emitter region can have a vertical thickness of about 10 nm to about 500 nm, or about 50 nm to about 150 nm. In certain embodiments, the emitter region can include an N-type dopant. The N-type dopant of the emitter region can be selected from the group consisting of Antimony, Arsenic, and Phosphorus.

In certain embodiments, the base region can have a lateral width that is between about 10 nm and about 400 nm (e.g., between about 200 nm and about 300 nm). In related embodiments, the base region can have a vertical thickness equal to or greater than the lateral width of the base region. For example, the vertical thickness of the base region is about two to four times greater than the lateral width of the base region, or about three to four times greater (e.g., about 3.5 times greater) than the lateral width of the base region. The base region can include a P-type dopant, such as Boron, Aluminum, Beryllium, Zinc, or Cadmium.

In certain embodiments, the collector region can have a lateral width that is between about 100 nm and about 1000 nm, or between about 600 nm and about 750 nm. In addition, the collector region can have a vertical thickness equal to or greater than the lateral width of the collector region. For example, the vertical thickness of the collector region can be about two to ten times greater than the lateral width of the collector region, or about four to eight times greater (e.g., about six times greater) than the lateral width of the collector region. In certain embodiments, the collector region can include an N-type dopant. The N-type dopant can be selected from the group consisting of Antimony, Arsenic, and Phosphorus. In certain embodiments, the collector region can have a resistivity of about 5 ohm-cm to about 10 ohm-cm.

In certain embodiments, the vertical thickness of the base region can be about 6 to 12 times greater than the vertical thickness of the emitter region. In certain embodiments, the vertical thickness of the collector region can be about 3 to 6 times greater than the vertical thickness of the base region.

In certain embodiments, the trench can have a vertical depth at least 10% greater than the combined vertical depth of the collector, base, and emitter regions. The vertical depth of the trench can be, for example, about 2,000 nm to about 11,000 nm. A lateral width of the trench can be about 100 nm to about 1000 nm. In certain embodiments, an electrically insulative material can be disposed in the trenches.

In certain embodiments, a pitch of the transistor structures of the array can be about 1000 nm to about 20,000 nm, or about 8000 nm to about 12,000 nm, or about 5000 nm to about 10,000 nm.

In certain embodiments, the common conductor can include an N+ semiconductor substrate upon which the array of transistor structures rests. The N+ semiconductor substrate include a dopant selected from the group consisting of Antimony, Arsenic, and Phosphorus. In certain embodiments, the N+ silicon substrate can have a resistivity of about 0.025 ohm-cm to about 0.050 ohm-cm.

In certain embodiments, a dielectric border can be disposed on the outer surface of the base, between adjacent pairs of transistor structures of the array. The border can overlay a perimeter portion of the emitter region of each transistor structure of the array, with openings (or windows) exposing an interior portion of the outer side of the emitter region. The windows of the dielectric border can expose the interior portions of the outer surfaces of the emitter regions of the transistor structures of the array to direct contact with fluidic medium in the flow path. In certain embodiments, the dielectric border can have a vertical thickness of about 750 nm to about 2,000 nm. In certain embodiments, the dielectric border can overlay a perimeter portion of the outer side of the emitter region by about 10 nm to about 200 nm.

In certain embodiments, the microfluidic structure and the base can together define a plurality of interconnected fluidic structures, with the flow path being one of the fluidic structures. The microfluidic structure and the base together further define at least one holding pen. The holding pen can be connected to the flow path. The flow path can include a fluidic channel.

The transistor structures of the array can connect different regions of the outer surface of the base to the common conductor, and the regions of the outer surface of the base can be disposed to contact directly fluidic medium in the flow path. In certain embodiments, the microfluidic device can further include a biasing electrode. The flow path can be disposed between the biasing electrode and the common electrical conductor of the base.

In certain embodiments, the base of the microfluidic device comprises a first section and a second section electrically insulated from the first section. The array of transistor structures can be a first array of transistor structures and a second array of transistor structures, and the first array of transistor structures can be located in the first section of the base and the second array of transistor structure can be located in the second section of the base. The common conductor can be a first common conductor that is common to the first array of transistor structures (e.g., transistor structures of the first section of the base) but not the second array of transistor structures (e.g., transistor structures of the second section of the base). The base can further include a second common conductor that is common to the transistor structures of the second section but not the transistor structures of the first section.

In another aspect, a microfluidic apparatus is provided which has first and second microfluidic devices, each configured in the manner of any of the microfluidic devices described or otherwise disclosed herein. The enclosure of the first microfluidic device can be separate and distinct from the enclosure of the second microfluidic device. The common electrical conductor of the first microfluidic device and the common electrical conductor of the second microfluidic device can be electrically connected. Thus, there can be an electrical conductor common to the first microfluidic device and the second microfluidic device.

In another aspect, a system is provided that includes a microfluidic device described or otherwise disclosed herein, and control equipment for controlling operation of the microfluidic device. The control equipment can include a flow controller for controlling a flow of fluidic medium in the flow path, and/or a light source, a spatial light modulator, and a light path for directing selected patterns of light into the enclosure. Alternatively, or in addition, the control equipment can include an optical device for capturing images inside the enclosure. The control equipment can include a processor for controlling operation of the microfluidic device.

In another aspect, methods of moving a micro-object in a fluidic medium in a microfluidic device are provided. The microfluidic device can be any of the microfluidic devices described or otherwise disclosed herein. The methods can include the steps of providing biasing power to a microfluidic device (e.g., the biasing electrode and the common electrical conductor of the base), and activating a first transistor structure at a first region of the outer surface of the base, thereby generating an eletrokinetic force in the vicinity of the activated first transistor structure sufficient to move a nearby micro-object in the flow path of the microfluidic device. In certain embodiments, activating the first transistor structure involves directing a beam of light onto the base region of the first transistor structure. The beam of light can have an intensity of about 0.1 W/cm$^2$ to about 1000 W/cm$^2$.

In certain embodiments, the biasing power provided to the microfluidic device has a peak-to-peak voltage of about 1 Vppk to about 50 Vppk. In certain embodiments, the biasing power has a frequency of about 100 kHz to about 10 MHz. In certain embodiments, the biasing power has a square waveform, a sine waveform, or a triangular waveform.

In certain embodiments, activating the first transistor structure can include inducing a first current flow in the lateral bipolar transistor of the first transistor structure. The first current flow can induce a non-uniform electric field in the flow path between the activated first transistor structure and the biasing electrode, and the non-uniform electric field can produce the electrokinetic force. The electrokinetic force can repel the nearby micro-object away from the non-uniform electric field. Thus, the electrokinetic force can move the nearby micro-object away from the first region of the outer surface of the base that corresponds to the activated first transistor structure.

In certain embodiments, activating the first transistor structure can include inducing a second current flow in the vertical bipolar transistor of the activated first transistor structure. The second current flow can enhance the electrokinetic force. For example, the second current flow can increase the magnitude of the electrokinetic force by at least 25%. In certain embodiments, a current density of the first current flow in the lateral transistor can be at least 1.5 times greater than a current density of the second current flow in the vertical transistor of the activated first transistor structure.

In certain embodiments, the micro-object can be a bead, such as a polystyrene bead or a glass bead. The bead can have a diameter of about 1 μm to about 50 μm. In certain embodiments, the micro-object can be a biological cell. The cell can be selected from the group consisting of SP2, HeLa, embryo, sperm, oocytes, and jurkat cells.

In certain embodiments, the fluidic medium in the flow path of the microfluidic device can be selected from the group consisting of PBS, RPMI, or DMEM. The fluidic medium in the flow path of the microfluidic device can have an electrical conductivity of about 10 mS/m to about 2 S/m.

In certain embodiments, the methods include maintaining a temperature of the fluidic medium in the flow path. The temperature can be maintained at about 5° C. to about 55° C.

DETAILED DESCRIPTION OF EXEMPLARY EMBODIMENTS

Figure 1:
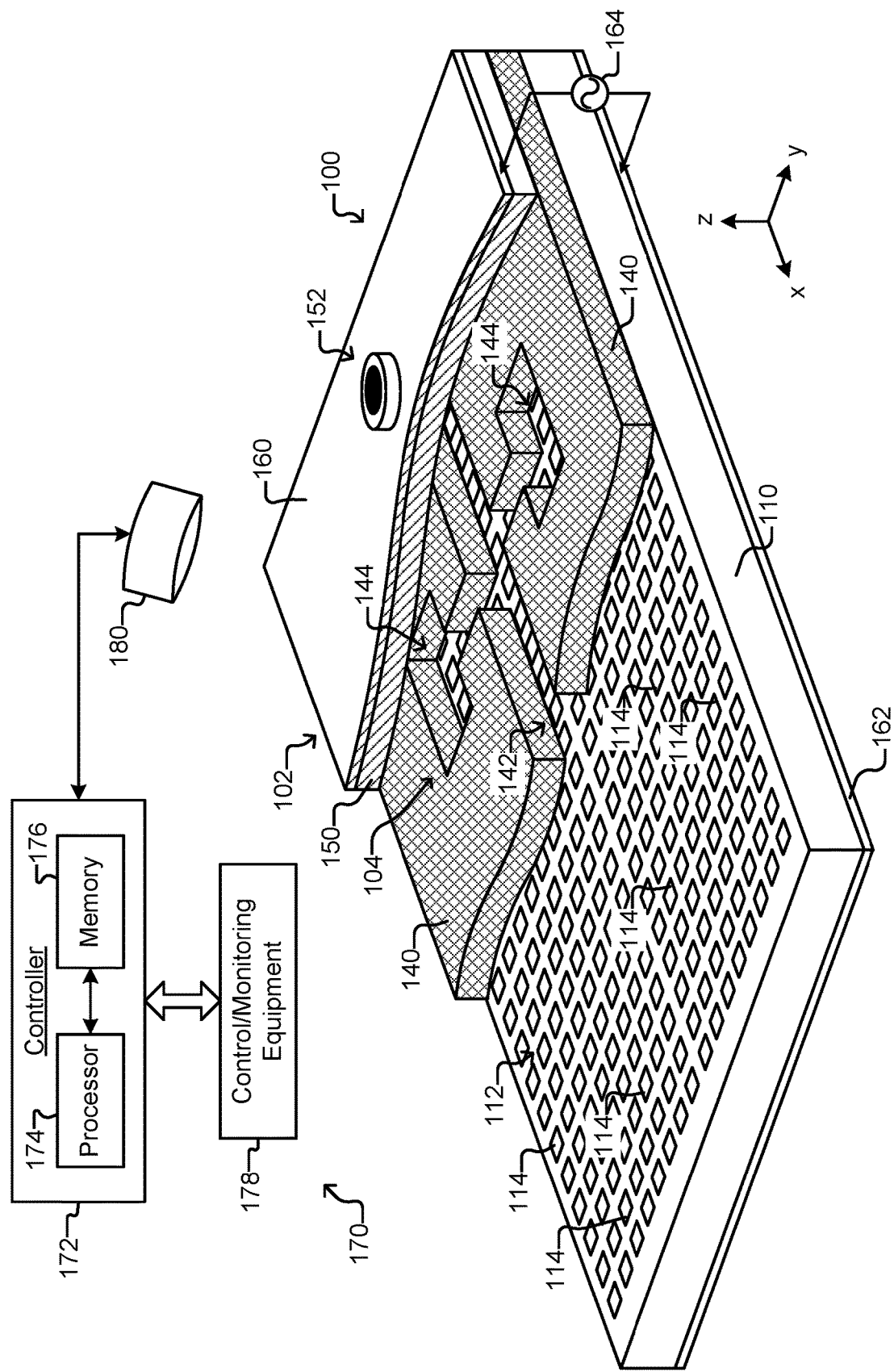
FIG. 1 illustrates an example of a microfluidic device configured for selective generation of localized electrokinetic forces inside the device according to some embodiments of the invention.

This specification describes exemplary embodiments and applications of the invention. The invention, however, is not limited to these exemplary embodiments and applications or to the manner in which the exemplary embodiments and applications operate or are described herein. Moreover, the figures may show simplified or partial views, and the dimensions of elements in the figures may be exaggerated or otherwise not in proportion. In addition, as the terms "on," "attached to," "connected to," "coupled to," or similar words are used herein, one element (e.g., a material, a layer, a substrate, etc.) can be "on," "attached to," "connected to," or "coupled to" another element regardless of whether the one element is directly on, attached to, connected to, or coupled to the other element or there are one or more intervening elements between the one element and the other element. Also, directions (e.g., above, below, top, bottom, side, up, down, under, over, upper, lower, horizontal, vertical, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

As used herein, "substantially," "generally," or "about" means sufficient to work for the intended purpose. The terms "substantially," "generally," or "about" thus allow for minor, insignificant variations from an absolute or perfect state, dimension, measurement, result, or the like such as would be expected by a person of ordinary skill in the field but that do not appreciably affect overall performance. When used with respect to numerical values or parameters or characteristics that can be expressed as numerical values, "substantially" or "generally" means within ten percent. The term "ones" means more than one. The term "disposed" encompasses within its meaning "located."

As used herein with regard to numerical values, dimensions, or parameters, the following abbreviations are defined as noted: "nm" means nanometer; "μm" means micrometer; "W/cm" means watts per centimeter; "W/cm$^2$" means watts per square centimeter; "kHz" means kilohertz; "MHz" means megahertz; "Vppk" means voltage peak-to-peak; and "mS/m" means millisiemens per meter. The symbol "/" means mathematical division.

As used herein, a "microfluidic device" or "microfluidic apparatus" is a device that includes one or more discrete microfluidic circuits configured to hold a fluid, each microfluidic circuit comprised of fluidically interconnected circuit elements, including but not limited to region(s), flow path(s), channel(s), chamber(s), and/or pen(s). Certain microfluidic devices (e.g., those that include a cover) will further include at least two ports configured to allow the fluid (and, optionally, micro-objects or droplets present in the fluid) to flow into and/or out of the microfluidic device. Some microfluidic circuits of a microfluidic device will include at least one microfluidic channel and/or at least one chamber. Some microfluidic circuits will hold a volume of fluid of less than about 1 mL, e.g., less than about 750, 500, 250, 200, 150, 100, 75, 50, 25, 20, 15, 10, 9, 8, 7, 6, 5, 4, 3, or 2 μL. In certain embodiments, the microfluidic circuit holds about 1-2, 1-3, 1-4, 1-5, 2-5, 2-8, 2-10, 2-12, 2-15, 2-20, 5-20, 5-30, 5-40, 5-50, 10-50, 10-75, 10-100, 20-100, 20-150, 20-200, 50-200, 50-250, or 50-300 μL.

As used herein, a "nanofluidic device" or "nanofluidic apparatus" is a type of microfluidic device having a microfluidic circuit that contains at least one circuit element configured to hold a volume of fluid of less than about 1 μL, e.g., less than about 750, 500, 250, 200, 150, 100, 75, 50, 25, 20, 15, 10, 9, 8, 7, 6, 5, 4, 3, 2, 1 nL or less. Typically, a nanofluidic device will comprise a plurality of circuit elements (e.g., at least 2, 3, 4, 5, 6, 7, 8, 9, 10, 15, 20, 25, 50, 75, 100, 150, 200, 250, 300, 400, 500, 600, 700, 800, 900, 1000, 1500, 2000, 2500, 3000, 3500, 4000, 4500, 5000, 6000, 7000, 8000, 9000, 10,000, or more). In certain embodiments, one or more (e.g., all) of the at least one circuit elements is configured to hold a volume of fluid of about 100 pL to 1 nL, 100 pL to 2 nL, 100 pL to 5 nL, 250 pL to 2 nL, 250 pL to 5 nL, 250 pL to 10 nL, 500 pL to 5 nL, 500 pL to 10 nL, 500 pL to 15 nL, 750 pL to 10 nL, 750 pL to 15 nL, 750 pL to 20 nL, 1 to 10 nL, 1 to 15 nL, 1 to 20 nL, 1 to 25 nL, or 1 to 50 nL. In other embodiments, one or more (e.g., all) of the at least one circuit elements is configured to hold a volume of fluid of about 100 to 200 nL, 100 to 300 nL, 100 to 400 nL, 100 to 500 nL, 200 to 300 nL, 200 to 400 nL, 200 to 500 nL, 200 to 600 nL, 200 to 700 nL, 250 to 400 nL, 250 to 500 nL, 250 to 600 nL, or 250 to 750 nL.

A "microfluidic channel" or "flow channel" as used herein refers to flow region of a microfluidic device having a length that is significantly longer than the horizontal dimension (and vertical dimension, if the microfluidic device includes a cover). For example, the flow channel can be at least 5 times the length of either the horizontal (or vertical) dimension, e.g., at least 10 times the length, at least 25 times the length, at least 100 times the length, at least 200 times the length, at least 500 times the length, at least 1,000 times the length, at least 5,000 times the length, or longer. In some embodiments, the length of a flow channel is in the range of from about 100,000 microns to about 500,000 microns, including any range therebetween. In some embodiments, the horizontal dimension is in the range of from about 100 microns to about 1000 microns (e.g., about 150 to about 500 microns) and, if present, the vertical dimension is in the range of from about 25 microns to about 200 microns, e.g., from about 40 to about 150 microns. It is noted that a flow channel may have a variety of different spatial configurations in a microfluidic device, and thus is not restricted to a perfectly linear element. For example, a flow channel may be, or include one or more sections having, the following configurations: curve, bend, spiral, incline, decline, fork (e.g., multiple different flow paths), and any combination thereof. In addition, a flow channel may have different cross-sectional areas along its path, widening and constricting to provide a desired fluid flow therein.

In some embodiments, a microfluidic device can comprise a base having an outer surface that is part of one or more enclosures for containing a fluidic medium. The base can comprise an array of individually controllable transistor structures each of which can comprise a lateral transistor and a vertical transistor, both of which can be photo transistors. Each transistor structure can be activated to create a temporary electrical connection from a region of the outer surface of the base (and thus fluidic medium in the enclosure) to a common electrical conductor. The temporary electrical connection can induce a localized electrokinetic force generally at the region, which can be sufficiently strong to move a nearby micro-object in the enclosure.

FIG. 1 illustrates an example of a microfluidic system comprising a microfluidic device 100 and a control and monitoring system 170. The microfluidic device 100 can comprise one or more enclosures 102, which can comprise one or more microfluidic circuit elements 104 (e.g., a microfluidic channel 142 and microfluidic chambers 144). The enclosure 102 and thus the microfluidic circuit elements 104 can be configured to contain one or more fluidic media (not show). For example, the media (not shown) can be disposed on an inner surface 112 of the enclosure 102. The microfluidic circuit elements 104 can be interconnected to form one or more microfluidic circuits. As shown, the inner surface 112 of the enclosure 102 can comprise electrokinetic elements configured to induce selectively localized electrokinetic forces sufficiently strong to move micro-objects (not shown) in the enclosure 102. An example of an electrokinetic force is a dielectrophoresis (DEP) force.

Although the enclosure 102 can be configured in a variety of ways, the enclosure 102 is illustrated in FIG. 1 as comprising an electrokinetic-configured base 110 (hereinafter referred to as an "EK-configured base"), a microfluidic structure 140, and a cover 150. The base 110, the microfluidic structure 140, and the cover 150 can be attached to each other. For example, the microfluidic structure 140 can be disposed on the base 110, and the cover 150 can be disposed over the microfluidic structure 140. The base 110, the microfluidic structure 140, and the cover 150 can define the enclosure 102 and thus the microfluidic circuit elements 104. One or more ports 152 can provide an inlet into and/or an outlet from the enclosure 102. There can be more than one port 152, each of which can be an inlet, an outlet, or an inlet/outlet port. Alternatively, there can be one port 152, which can be an inlet/outlet port. The port or ports 152 can comprise, for example, a through passage, a valve, or the like.

The EK-configured base 110 can comprise a substrate or a plurality of substrates, which may be interconnected. For example, the EK-configured base 110 can comprise one or more semiconductor substrates. The EK-configured base 110 can further comprise a printed circuit board assembly ("PCBA"). For example, the substrate(s) can be mounted on a PCBA. As noted, the microfluidic structure 140 can be disposed on the base 110. The inner surface 112 of the enclosure 102 can comprise an outer surface of the base 110, which can thus provide some of the walls (e.g., floor walls) of the enclosure 102 and thus the microfluidic circuit elements 104. The surface 112 can comprise electrokinetic elements 114, which can be individually controllable to selectively induce localized electrokinetic forces on micro-objects (not shown) in the enclosure 102. As will be seen, each electrokinetic element 114 can comprise a transistor structure that comprises both a lateral and a vertical transistor, both of which can be photo transistors. The microfluidic device 100 can comprise biasing electrodes 160, 162 to which a biasing power source 164 can be connected for powering the electrokinetic elements 114. The enclosure 102 can be disposed directly between the biasing electrodes 160, 162 as shown. The biasing electrodes 160, 162 can each comprise one or more electrical conductors (e.g., electrically conductive plates, traces, or the like). The electrical conductors/conductive plates of the biasing electrodes 160, 162 can be individually addressable. The individually addressable conductors/conductive plates can be electrically connected to different regions of the EK-configured base 110, thereby providing an EK-configured base 110 having discrete EK-configured regions. For example, for EK-configured bases 110 that comprise a plurality of substrates, each substrate can be electrically connected to a single individually addressable conductive plate of the biasing electrode 162. The individually addressable conductors/conductive plates can be connectable to one or more AC voltage sources via corresponding transistor switches.

The microfluidic structure 140 can comprise cavities or the like that provide some of the walls of the enclosure 102 and thus the microfluidic circuit elements 104. For example, the microfluidic structure 140 can provide sidewalls of the microfluidic circuit elements 104. The microfluidic structure 140 can comprise a flexible and/or resilient material such as rubber, plastic, elastomer, silicone (e.g., phote-patternable silicone or "PPS"), polydimethylsiloxane ("PDMS"), or the like, any of which can be gas permeable. Other examples of materials that can compose the microfluidic structure 140 include rigid materials such as molded glass, an etchable material such as silicon, photoresist (e.g., SU8), or the like. The foregoing materials can be substantially impermeable to gas. Examples of the microfluidic circuit elements 104 illustrated in FIG. 1 include a microfluidic channel 142 (an example of a flow path) to which microfluidic chambers 144 (e.g., holding pens) are fluidically connected. Other examples of microfluidic circuit elements 104 include microfluidic reservoirs (not shown), microfluidic wells (not shown), and the like.

The cover 150 can be disposed on the microfluidic structure 140 and can provide some of the walls (e.g., ceiling walls) of the enclosure 102 and thus the microfluidic circuit elements 104. In some embodiments, the cover 150 can comprise a substantially rigid material. The one or more ports 152 can provide one or more passages through the biasing electrode 162 and the cover 150 into the enclosure 102. Fluidic media (not shown) can thus be input into or extracted from the enclosure 102 through the port(s) 152. Although the cover 150 is disposed above the microfluidic structure 140 in FIG. 1, the foregoing orientation can be different. For example, the base 110 can be disposed above the microfluidic structure 140, which can be above the cover 150.

FIG. 1 also illustrates an example of a control and monitoring system 170 for controlling and monitoring the microfluidic device 100. As shown, the system 170 can comprise a controller 172 and control/monitoring equipment 178. Although shown separately in FIG. 1, the controllable light projection system 180 can be considered part of the control/monitoring equipment 178. The controller 172 can be configured to control and monitor the device 100 directly and/or through the control/monitoring equipment 178.

The controller 172 can comprise a digital processor 174 and a digital memory 176. The processor 174 can be, for example, a digital processor, computer, or the like, and the digital memory 176 can be a digital memory for storing data and machine executable instructions (e.g., software, firmware, microcode, or the like) as non-transitory data or signals. The processor 174 can be configured to operate in accordance with such machine executable instructions stored in the memory 176. Alternatively or in addition, the processor 174 can comprise hardwired digital circuitry and/or analog circuitry. The controller 172 can thus be configured to perform any process (e.g., process 800 of FIG. 8), step of such a process, function, act, or the like discussed herein. The controller 172 or any part of the controller 172 is sometimes referred to herein as a "circuit" or "circuits" regardless of whether the processor 174 is configured to operate in accordance with machine executable instructions stored in the memory 176 and/or comprises hardwired digital logic circuitry and/or analog circuitry.

The controllable light projection system 180 can comprise a light source (e.g., a Mercury lamp such as a high pressure Mercury lamp, a Xenon arc lamp, or the like), a spatial light modulator (e.g., a digital mirror device (DMD), a microshutter array system (MSA), a transmissive liquid crystal display (LCD), a liquid crystal on silicon (LCOS) device, a ferroelectric liquid crystal on silicon device (FLCOS), a scanning laser device, or the like), and a light path (e.g., an optical train) for directing selected patterns of light into the enclosure 102. For example, the controller 172 can cause the light projection system 180 to project changing patterns of light into the enclosure 102.

In addition to comprising a controllable light projection system 180, the control/monitoring equipment 178 can comprise any of a number of different types of equipment for controlling or monitoring the microfluidic device 100 and processes performed with the microfluidic device 100. For example, the equipment 178 can include power sources (not shown) for providing power to the microfluidic device 100; fluidic media sources (not shown) for providing fluidic media for or receiving fluidic media from the microfluidic device 100; a flow controller (not shown) for controlling a flow of media in the enclosure 102; image capture mechanisms (not shown) such as an optical device (not shown) for capturing images (e.g., of micro-objects) inside the enclosure 102; stimulation mechanisms (not shown) for directing energy into the enclosure 102 to stimulate reactions; or the like.

Figure 2:
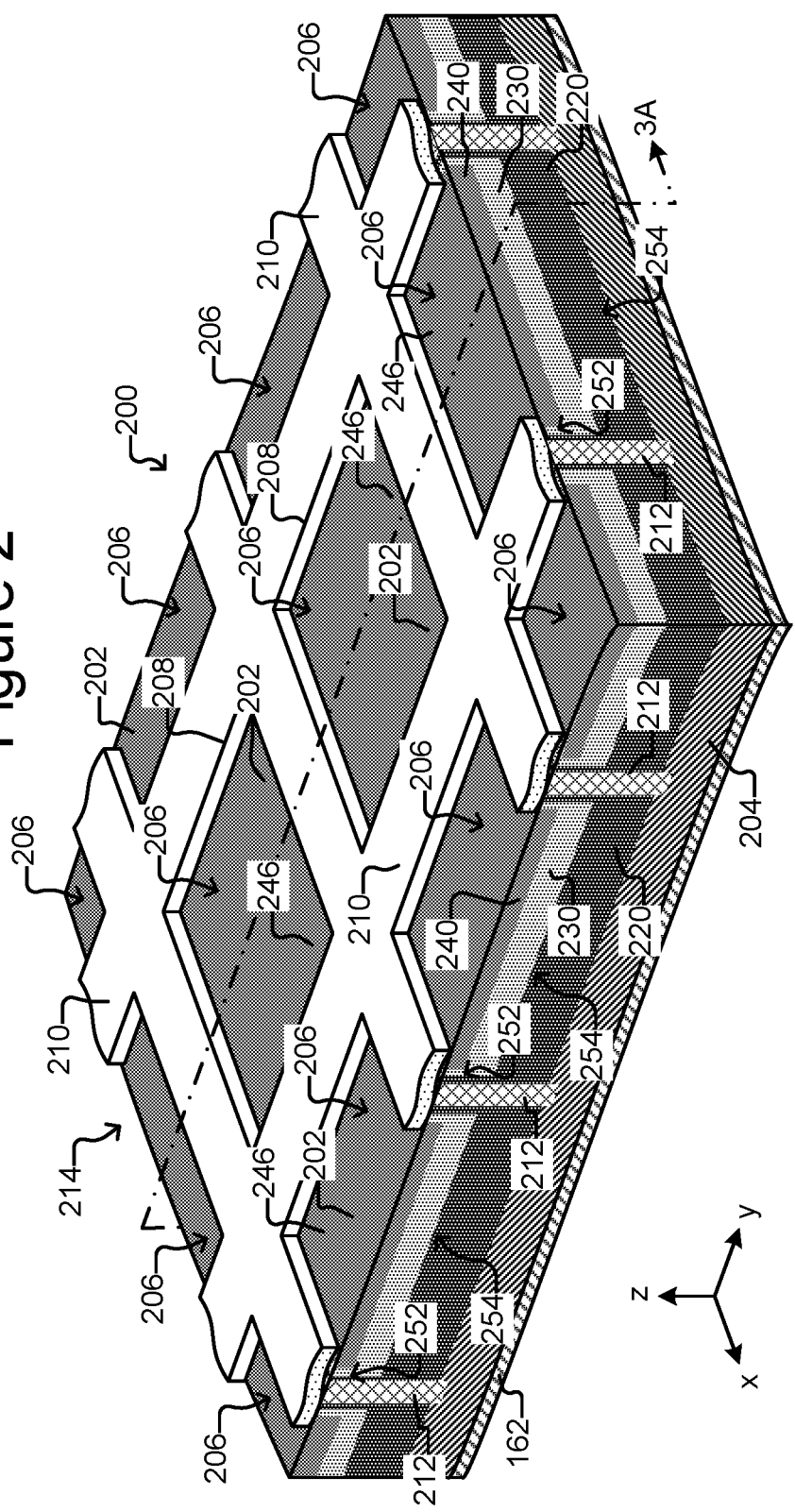
FIG. 2 is a perspective, cross-sectional partial view of an example configuration of the base of the device of FIG. 1 according to some embodiments of the invention.

All or parts of the enclosure 102 can be disposed between the electrodes 160, 162. For example, as shown, the biasing electrode 160 can be disposed on the cover 150, and the biasing electrode 162 can be disposed on the base 110. Examples of the biasing power source 164 include an alternating current (AC) power source. FIGS. 2-4 illustrate an example 200 configuration of the EK-configured base 110 of FIG. 1 in which the electrokinetic elements 114 are implemented as transistor structures 206 each comprising a lateral transistor 252 and a vertical transistor 254. The EK-configured base 200 can thus replace the base 110 in FIG. 1 and/or any discussion herein. The outer surface 214 of the base 200 in FIG. 2 is equivalent to the inner surface 112 of the enclosure 102 in FIG. 1. Fluidic medium (not shown) in the enclosure 102 can thus be directly on the outer surface 214 of the base 200 and thus in direct contact with features of the outer surface 214 such as the border 210 and regions 202 of the surface 214 exposed by the openings 208 in the border 210. In FIG. 2, the EK-configured base 200 is shown disposed on biasing electrode 162.

As shown, the EK-configured base 200 can comprise an array of transistor structures 206 each of which can be activated to selectively connect a distinct region 202 of the outer surface 214 of the base 200 to a common conductor (e.g., a support substrate 204 and/or the biasing electrode 162). As will be seen, this can temporarily create generally above the region 202 a localized electrokinetic force in fluidic media (not shown) disposed on the outer surface 214 in the enclosure 102. Disposed in the enclosure 102, such media (not shown) can be in direct contact with the region 202. Although the array of transistor structures 206 is illustrated in FIG. 2 as being in a regular pattern of rows and columns, the transistor structures 206 can be disposed in other patterns including irregular patterns. The array of transistor structures 206 can thus be a regular or an irregular array.

The transistor structures 206 can be disposed (e.g., rest) on a support layer 204. A dielectric border layer 210 and electrically insulating barriers 212 can physically separate the transistor structures 206. The border layer 210 can be disposed on and thus be considered part of the outer surface 214. The border layer 210 can provide an outer dielectric border between adjacent transistor structures 206 but also provide openings 208 to the transistor structures 206 individually. The barriers 212 can extend from the border layer 210 into the support layer 204 and physically separate adjacent transistor structures 206 within the base 200. As shown, the openings 208 can be sized so that the border layer 210 overlaps an outer perimeter of the outer side 246 of the emitter region 240 of a transistor structure 206. Hereinafter, the portions of the border layer 210 that overlaps a perimeter portion of the emitter region 240 are referred to as an overlap and labeled 256 in FIG. 3A. The border layer 210 can comprise a dielectric material examples of which include silicon oxide. The barriers 212 can comprise an electrically insulating material.

Figure 3A:
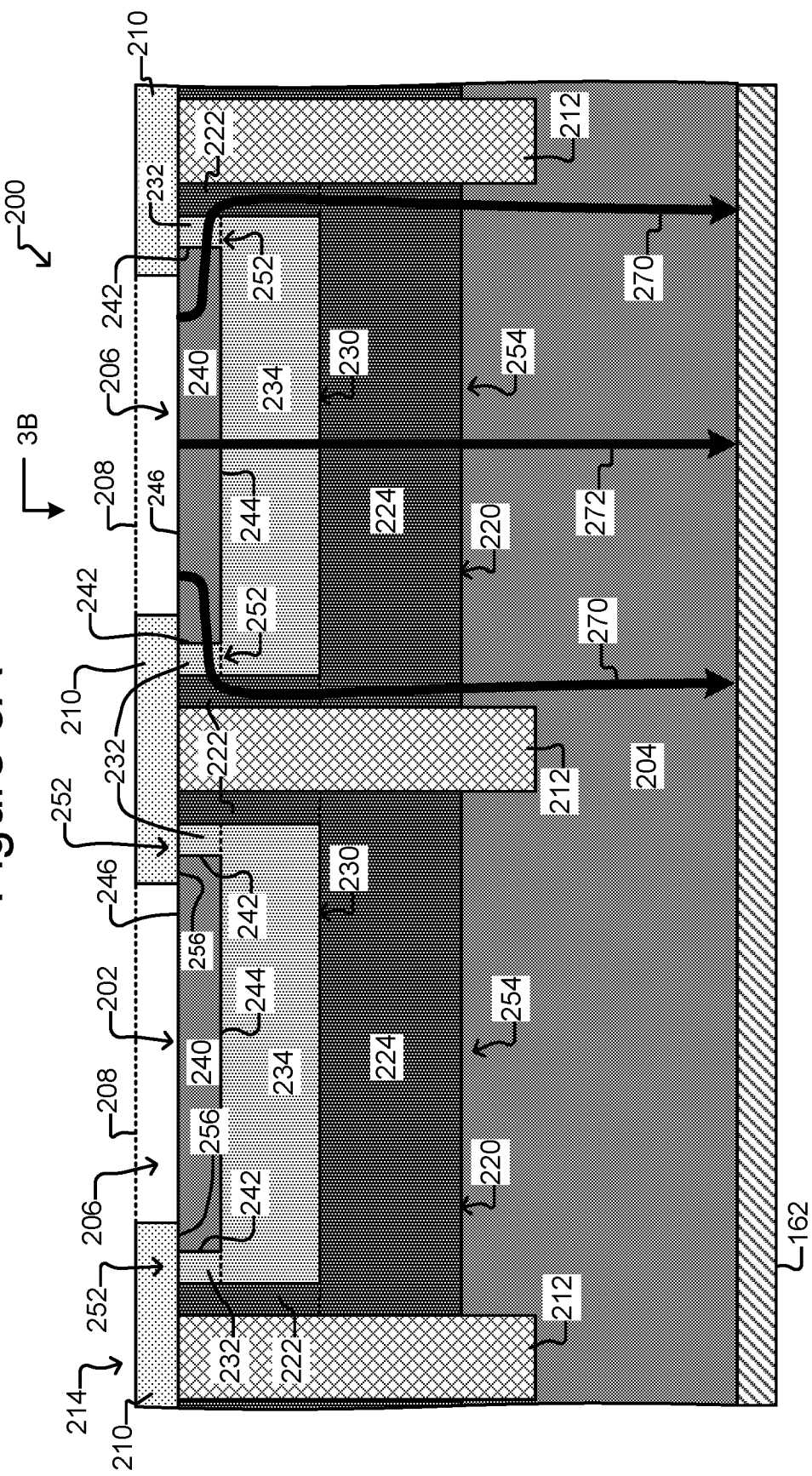
FIG. 3A is a side, cross sectional view of the base of FIG. 2.
Figure 3B:
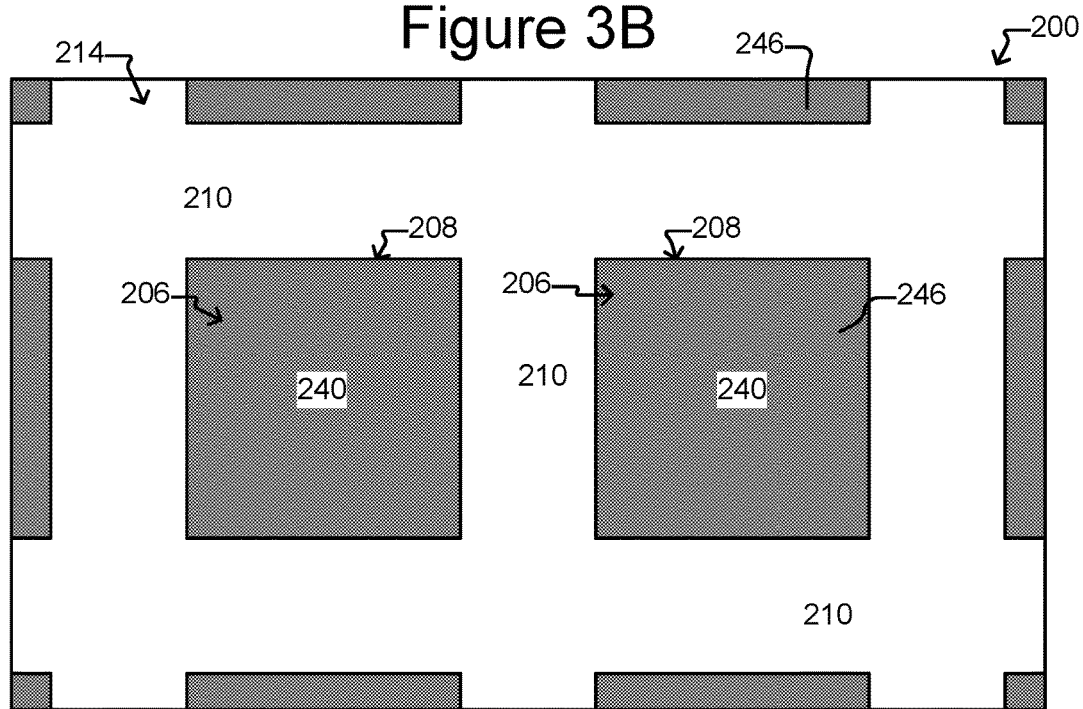
FIG. 3B is a top view of FIG. 3A.
Figure 3C:
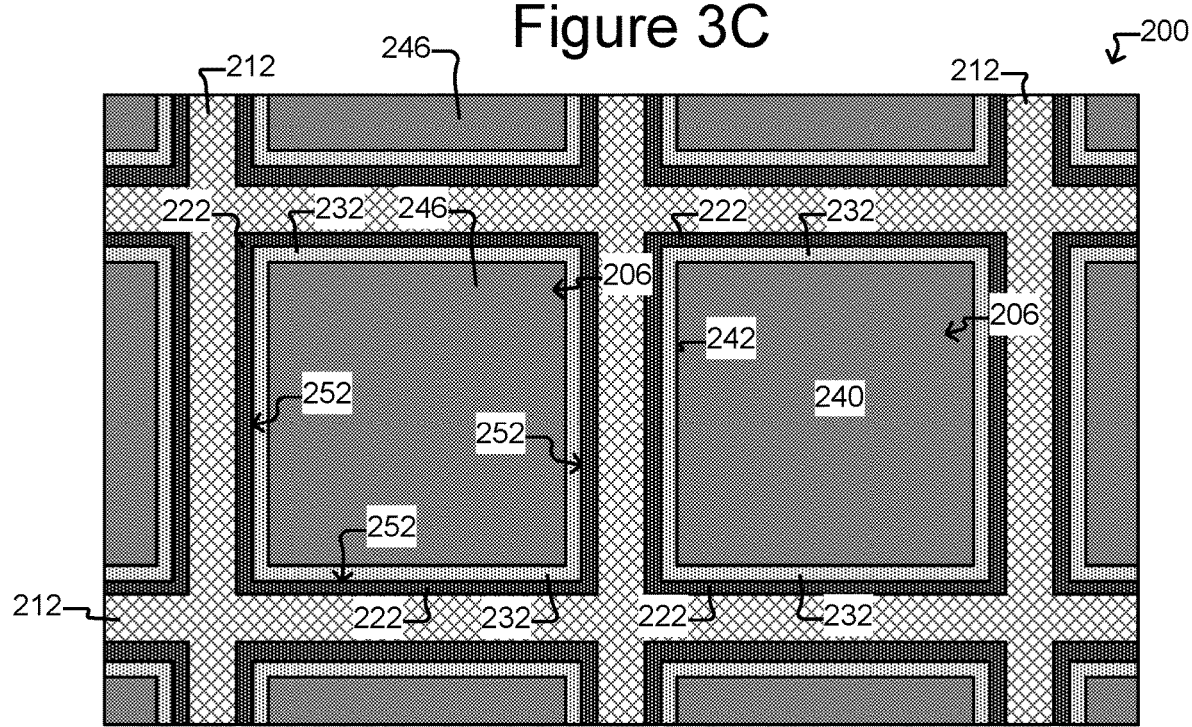
FIG. 3C is the top view of FIG. 3B without border structures.
Figure 4:
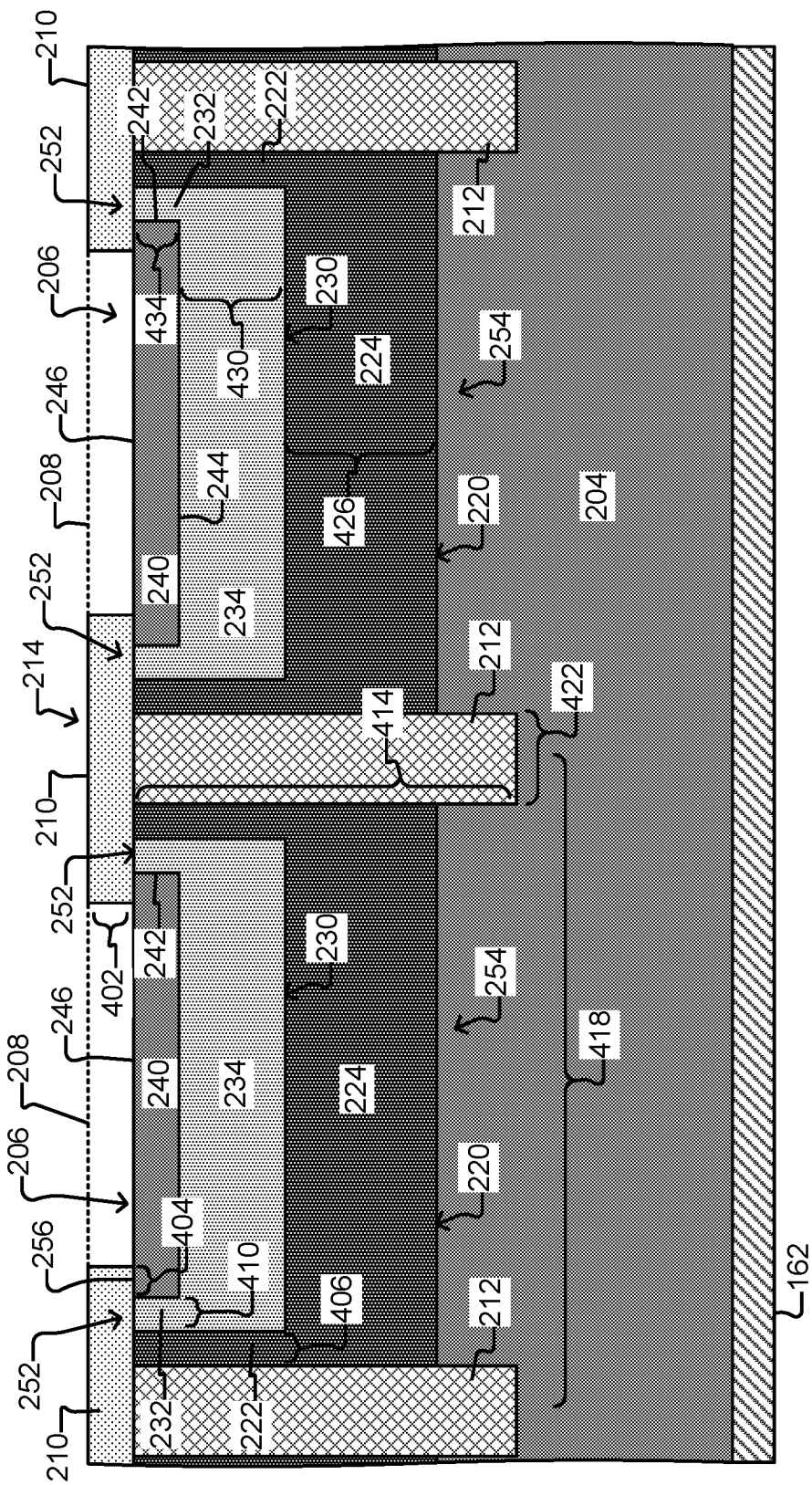
FIG. 4 is the side, cross-section view of FIG. 3A in which various dimensions are labeled.

As best seen in FIGS. 3A-3C, each transistor structure 206 can comprise an emitter region 240, a base region 230, and a collector region 220. The emitter region 240 can be disposed in the base region 230, which can be disposed in the collector region 220 as shown. The barriers 212 can extend from the border structure 210 sufficiently into the base 200 to physically separate the emitter region 240, base region 230, and collector region 220 of one transistor structure 206 from the emitter region 240, base region 230, and collector region 220 of adjacent transistor structures 206.

As shown, the emitter region 240 can comprise an outer side 246 that comprises part of the outer surface 214, an inner side 244 that is opposite the outer side 246, and vertical sides 242. The regions 202 of the outer surface 214 of the base 200 can be the interior portions of the outer side 246 of the emitter region 240 exposed by the openings 208 in the border 210.

The base region 230 and the collector region 220 can comprise lateral portions 232, 222 and vertical portions 234, 224. The lateral portion 232 of the base region 230 can be disposed between a lateral side 242 of the emitter region 240 and the lateral portion 222 of the collector region 220 as illustrated in FIG. 3A. The lateral portion 222 of the collector region 220 can be disposed between the lateral portion 232 and the vertical portion 234 of the base region 230 and the barriers 212 that separate the transistor structure 206 from adjacent transistor structures 206.

The vertical portion 234 of the base region 230 can be disposed between the inner side 244 of the emitter region 240 and the vertical portion 224 of the collector region 220. The vertical portion 224 of the collector region 220 can similarly be disposed between the vertical portion 234 of the base region 230 and the supporting layer 204.

Each transistor structure 206 can comprise multiple transistors. For example, a transistor structure 206 can comprise a lateral transistor 252 (e.g., a bipolar junction transistor) comprising the emitter region 240, the lateral portion 232 of the base region 230, and the lateral portion 222 of the collector region 220. The foregoing lateral transistor 252 can, when activated, provide a lateral conduction path 270 from the outer side 246 (and thus a region 202 of the outer surface 214 of the base 200) of the emitter region 240 to the support layer 204 and biasing electrode 162 as follows: the lateral conduction path 270 can be from the outer side 246 of the emitter region 240 through a lateral side 242 of the emitter region 240, into and through the lateral portion 232 of the base region 230, into and through the lateral portion 222 of the collector region 220, then into and through the vertical portion 224 of the collector region 220 to the support layer 204, and through the support layer 204 to the biasing electrode 162.

The transistor structure 206 can also comprise a vertical junction transistor 254 (e.g., another bipolar junction transistor), which can comprise the emitter region 240, the vertical portion 234 of the base region 230, and the vertical portion 224 of the collector region 220. The foregoing vertical transistor 254 can, when activated, provide a vertical conduction path 272 from the region 202 of the outer surface 214 of the base 200 comprising the outer side 246 of the emitter region 240 to the support layer 204 and biasing electrode 162 as follows: the vertical conduction path 272 can be from the outer side 246 of the emitter region 240 through to the inner side 244 of the emitter region, into and through the vertical portion 234 of the base region 230, into and through the vertical portion 224 of the collector region 220, then into and through the support layer 204 to the biasing electrode 162. Thus, a transistor structure 206, when activated, can provide a lateral conduction path 270 through a lateral transistor 252 and a vertical conduction path 272 through a vertical transistor 254 from a region 202 of the outer surface 214 of the base 200 comprising the outer side 246 of the emitter region 240 to the support layer 204 and the biasing electrode 162. As will be seen, the support layer 204 and the biasing electrode 162 can be electrically conductive and either or both can thus be examples of a common conductor.

The base 200 can comprise a semiconductor substrate. For example, the base 200 can comprise a silicon substrate, a gallium arsenide substrate, or the like. The support layer 204, the collector regions 220, the base regions 230, and the emitter regions 240 can comprise doped regions of the semiconductor substrate. For example, the support layer 204, the collector regions 220, and the emitter regions 240 can be doped with a first type of dopant, and the base regions 230 can be doped with an opposite type of dopant. Thus, for example, the support layer 204, the collector regions 220, and the emitter regions 240 can be doped with an N dopant, and the base regions 230 can be doped with a P dopant. As another example, the support layer 204, the collector regions 220, and the emitter regions 240 can be doped with a P dopant, and the base regions 230 can be doped with an N dopant.

Regions that are doped with the same type of dopant can nevertheless be doped with different concentrations of the dopant. For example, one or more of the support layer 204, the collector regions 220, and/or the emitter regions 240 can be doped as a so called N+ region while the other or others of those regions are doped as N regions, where + denotes a greater concentration of the N dopant. Similarly, if the support layer 204, the collector regions 220, and the emitter regions 240 are P doped, one or more of those regions can be doped as a P+ region. Furthermore, as persons skilled in the art will understand, N+ and N-doped regions can comprise P dopants, provided that the N dopants are of greater abundance than the P dopants and dominate the overall electrical characteristics of the region. Similarly, P+ and P-doped regions can comprise N dopants, provided that the P dopants are of greater abundance than the N dopants and dominate the overall electrical characteristics of the region. The N dopant can be any source of negative carriers (e.g., electrons). Examples of suitable N or N+ dopants include Phosphorus, Arsenic, Antimony, and the like. The P dopant can be any source of positive carriers (e.g., holes). Examples of suitable P or P+ dopants include Boron, Aluminum, Beryllium, Zinc, Cadmium, Indium, or the like.

The support layer 204 can be heavily doped and thus, for example, be an N+ region with a resistivity between about 0.025 ohm-cm and about 0.050 ohm-cm. The collector regions 220 and/or the emitter regions 240 can be less heavily doped and thus, for example, can be N regions with a resistivity of between about 5 ohm-cm to about 10 ohm-cm. Alternatively, the emitter region 240 can be heavily doped. For example, the doping density of the emitter region 240 can be in the range of about $10^{18}$ cm$^{-3}$ to about $10^{21}$ cm$^{-3}$. The doping density of the base regions 230 can be in the range of about $10^{16}$ cm$^{-3}$ to about $10^{18}$ cm$^{-3}$. The foregoing numerical values and ranges are provided only as examples but are not intended to be limiting.

FIG. 4 identifies certain dimensions of the base 200. Examples of suitable sizes of the illustrated dimensions include the following. A thickness 402 of the border 210 can be between about 750 nm and about 2,000 nm, or about 750 nm and about 850 nm. A length 404 of the overlay 256 of the border 210 over the perimeter of the emitter region 240 can be between about 10 nm and about 200 nm. A width 406 of the lateral portion 222 of a collector region 220 can be as follows: between about 100 nm and about 1,000 nm; or between about 600 nm and about 750 nm. A width 410 of the lateral portion 232 of the base region 230 can be between about 10 nm and about 400 nm; or between about 200 nm and about 300 nm. A thickness 434 of an emitter region 240 can be as follows: between about 10 nm and about 500 nm; or between about 50 nm and about 150 nm. A thickness 430 of the vertical portion 234 of the base region 230 can be any of the following with respect to the width 410 of the lateral portion 232: greater than or equal; two to four times greater; three to four times greater; or 3.5 times greater. The thickness 426 of the vertical portion 224 of the collector region 220 can be any of the following with respect to the width 406 of the lateral portion 222: greater than or equal; two to ten times greater; four to eight times greater; or six times greater. The thickness 430 of the vertical portion 234 of the base region 230 can be six to twelve times greater than the thickness 434 of the emitter region 440. The thickness 426 of the vertical portion 224 of the collector region 220 can be three to six times greater than the thickness 430 of the vertical portion 234 of the base region 230. The foregoing numerical values and ranges are provided only as examples but are not intended to be limiting.

A vertical length 414 of a barrier 212 from the border 210 into the base 200 can be as follows: between about 2,000 nm and about 11,000 nm; or at least 10% greater than the combined thicknesses 434, 430, 426 of the emitter region 240, the vertical portion 234 of the base region 230, and the vertical portion 224 of the collector region 220. A pitch 418 of the barriers 212 (e.g., the distance between vertical center axes of adjacent barriers 212), which is also the pitch of the transistor structures 206 can be as follows: between about 1,000 nm and about 20,000 nm; between about 8,000 nm and about 12,000 nm; or between about 5,000 nm and about 10,000 nm. A width 422 of a barrier 212 can be between about 100 nm and about 1,000 nm. The foregoing numerical values and ranges are provided only as examples but are not intended to be limiting.

Figure 5:
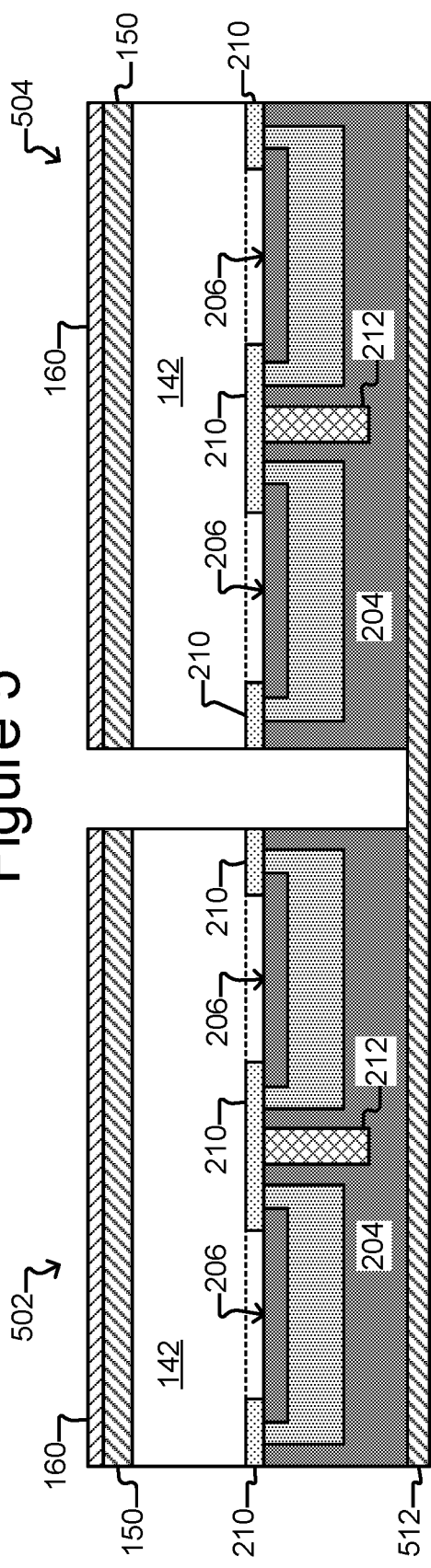
FIG. 5 is a side, cross-sectional view of multiple microfluidic devices that share the same common electrical conductor according to some embodiments of the invention.
Figure 6:
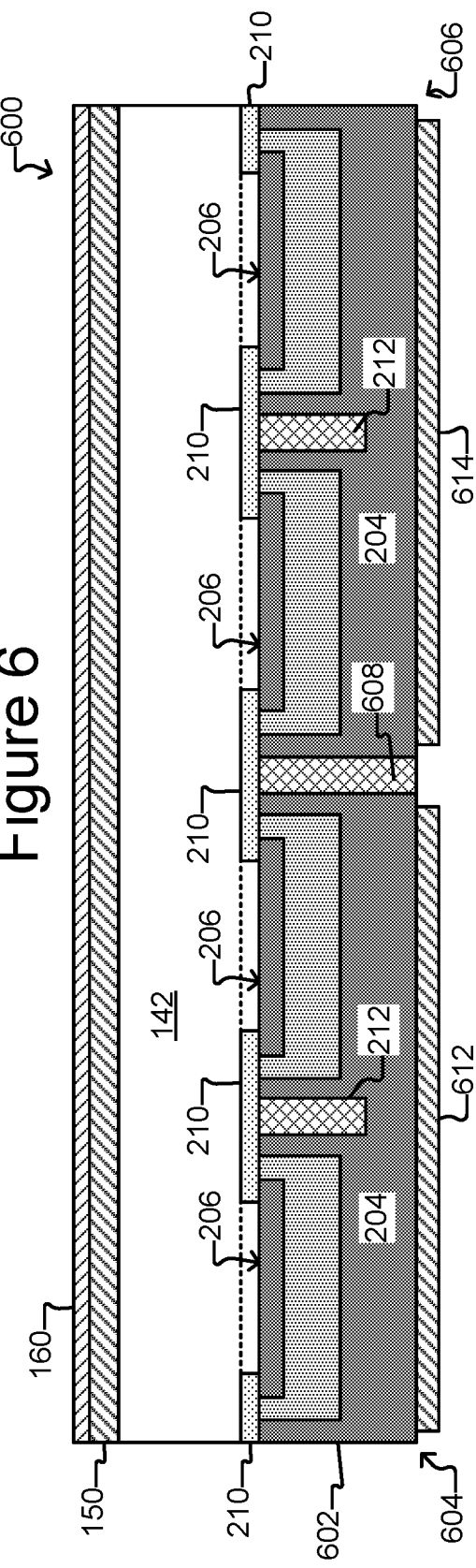
FIG. 6 is a side, cross-sectional view of a microfluidic device comprising multiple electrical conductors common to different sections of the device according to some embodiments of the invention.

The EK-configured base 200 as illustrated in FIGS. 2-4 is an example and variations are contemplated. For example, in one or more of the transistor structures 206, the region 240 can be a collector region and region 220 can be an emitter region. As another example, one or both of the lateral transistor 252 and/or the vertical transistor 254 can be a type of transistor other than a junction transistor. For example, one or both of the lateral transistor 252 and/or the vertical transistor 254 can be a field effect transistor. FIGS. 5 and 6 illustrate examples of additional variations.

FIG. 5 shows a plurality of microfluidic devices 502, 504 (two are shown but there can be more) each of which can be like the device 100 of FIG. 1, with the base 200 of FIGS. 2-4 replacing base 110. As shown, the microfluidic devices 502, 504 can be distinct and separate from each other but share the same common electrical connector 512, which can otherwise be like the biasing electrode 162 of FIG. 1.

FIG. 6 depicts a microfluidic device 600 comprising a base 602 comprising a plurality of sections 604, 606 that are electrically insulated one from another. A first section 604 of the base 602 can be like the base 200 of FIGS. 2-4, comprising an array of transistor structures 206 separated by barriers 212. A second section 606 can similarly be like the base 200, comprising another array of transistor structures 206 separated by other barriers 212. Although the sections 604, 606 are part of the same base 602, the sections 604, 606 can be electrically insulated from each other, for example, by an electrically insulating separator 608. As shown, the first section 604 can comprise a first common electrical conductor 612 that is connected and thus common to the transistor structures 206 of the first section 604 but not the transistor structures 206 of the second section 606. Similarly, the second section 606 can comprise a second common electrical conductor 614 that is connected and thus common to the transistor structures 206 of the second section 606 but not the transistor structures 206 of the first section 604.

Figure 7:
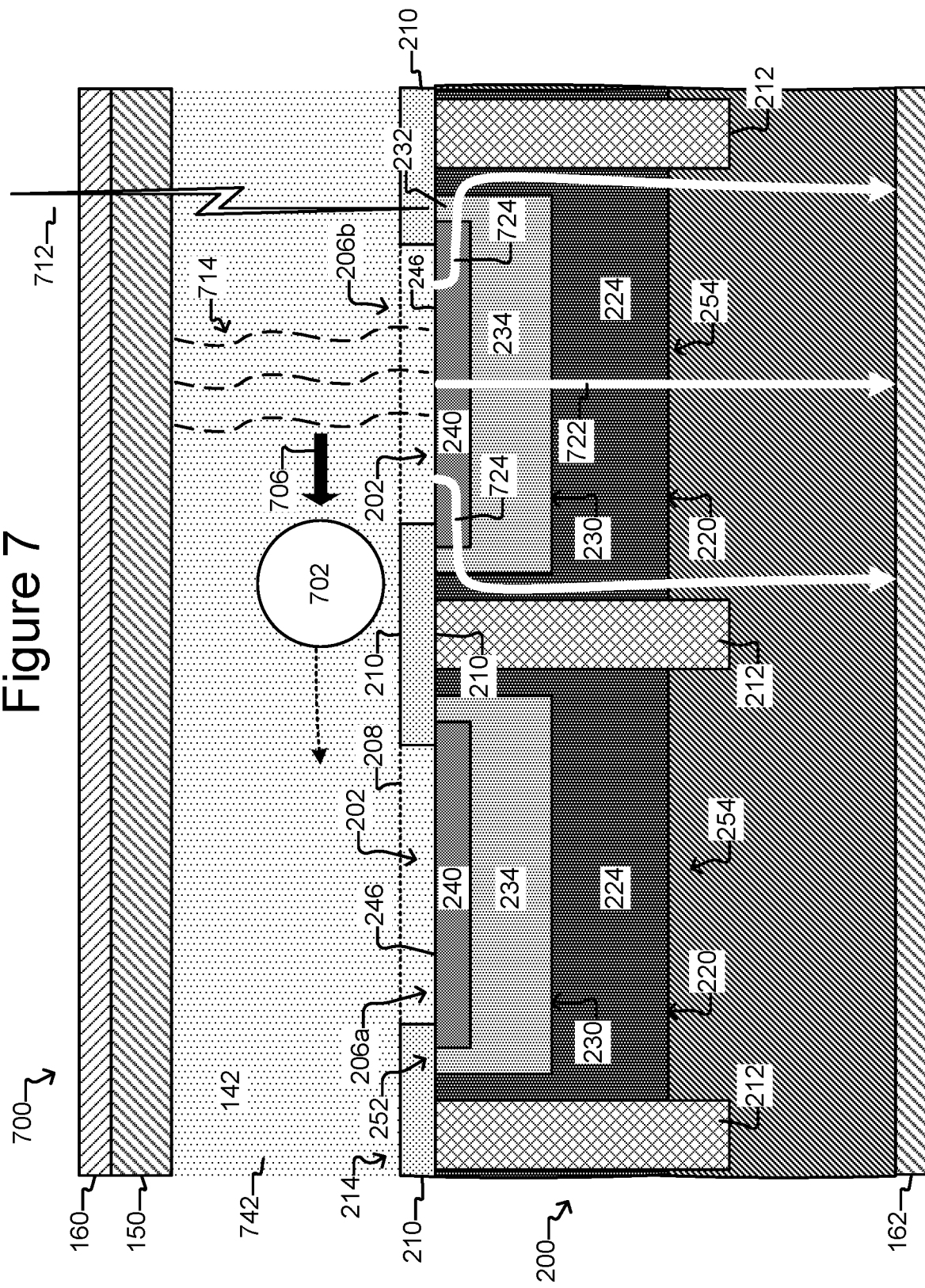
FIG. 7 is a side, cross-sectional partial view of a microfluidic device comprising the base of FIG. 2 and illustrating an example of selectively moving a micro-object in the device according to some embodiments of the invention.

FIG. 7 illustrates a partial, cross-sectional side view of the device 100 of FIG. 1 in which the EK-configured base 200 of FIGS. 2-4 replaces the base 110. A micro-object 702 is shown disposed in a fluidic medium 742 in the channel 142. As shown, one of the transistor structures 206b can be activated, turning on its lateral transistor 252 and vertical transistor 254. This can result in a lateral current flow 724 along the lateral current path 270 (shown in FIG. 3A) and a vertical current flow 722 along the vertical current path 272 (also shown in FIG. 3A). This can induce a localized non-uniform electric field 714 between the biasing electrode 160 and the outer side 246 of the emitter region 240 of the activated transistor structure 206b. The non-uniform electric field 714 can create a localized electrokinetic force 706 (e.g., a DEP force) in the enclosure generally above the region 202 of the surface 214 of the base 200 that corresponds to the outer side 246 of the activated transistor structure 206b.

The combination of both the lateral current flow 724 and the vertical current flow 722 can enhance the strength of the electrokinetic force 706 beyond the force that would be created by only one of the current flows 722, 724. It is believed that the lateral current flow 724 can increase the electrokinetic force 706 by at least 5%, at least 10%, at least 15%, at least 20%, at least 25%, at least 30%, at least 35%, at least 40%, at least 45%, at least 50%, at least 55%, at least 60%, at least 65%, or more over the electrokinetic force that would be created by only the vertical current. In some embodiments, the lateral current flow 724 can be at least 1.5 times greater than the vertical current flow 722.

The force 706 created by the non-uniform electric field 714 can be a repelling force (as illustrated in FIG. 7), which can be sufficiently strong to push a nearby micro-object 702 away from the activated transistor structure 206b, for example, to an unactivated transistor structure 206a. Alternatively, although not shown in FIG. 7, the force 706 created by the non-uniform electric field 714 can be an attractive force that pulls the micro-object 702 to the non-uniform electric field 714. Whether the force 706 is a repelling or an attractive force can depend on a number of parameters including the conductivity of the medium 742; the frequency of the biasing power (e.g., provided by the biasing power source 164 (see FIG. 1)); and/or the like.

The transistor structures 206 can be configured to be activated in any of a number of ways. For example, a transistor structure 206 can be activated by activating its base region 230, which can cause the current flows 722, 724 discussed above. In some embodiments, the transistor structures 206 can be photo transistor structures configured to be activated by a beam of light directed onto the base region 230. For example, as illustrated in FIG. 7, the transistor structure 206b can be activated by directing a beam of light 712 onto the lateral portion 232 of its base region 230. Alternatively, or in addition, the transistor structure 206b can be activated by directing a beam of light (not shown) onto the vertical portion 234 of its base region 230. The biasing electrode 160 and cover 150 can be substantially transparent to light and/or position to provide a path for the light beam (e.g., 712). A thickness of the border 210 can be sufficiently thin to allow the light beam 712 to penetrate to the lateral portion 232 of the base region 230, and/or the thickness of the emitter region 240 can be sufficiently thin to allow the light beam to penetrate to the vertical portion 234 of the base region 230. Examples of suitable thicknesses of the border 210 and emitter region 240 are provided above.

As also shown in FIG. 7, in the absence of a light beam, a transistor structure 206a is not activated. The transistor structures 206 in an array of transistor structures 206 can thus be individually activated and deactivated by directing individual light beams 712 onto the base regions 230 of the transistor structures 206 and then removing the light beams 712. As noted above, the controller 172 can control and change the pattern of light directed by the controllable light projection system 180 into the enclosure 102 and thus control and change activation of individual and patterns of the EK elements 114 configured like the transistor structures 206 shown in FIG. 7.

Alternatively, one or more of the transistor structures 206 can be configured to be activated in ways other than light. For example, individual electrical leads (not shown) can be provided to the base region 230 of one or more of the transistor structures 206, which can thus be activated by applying an activating signal through the lead to the base region 230 and deactivated by removing the activating signal.

Figure 8:
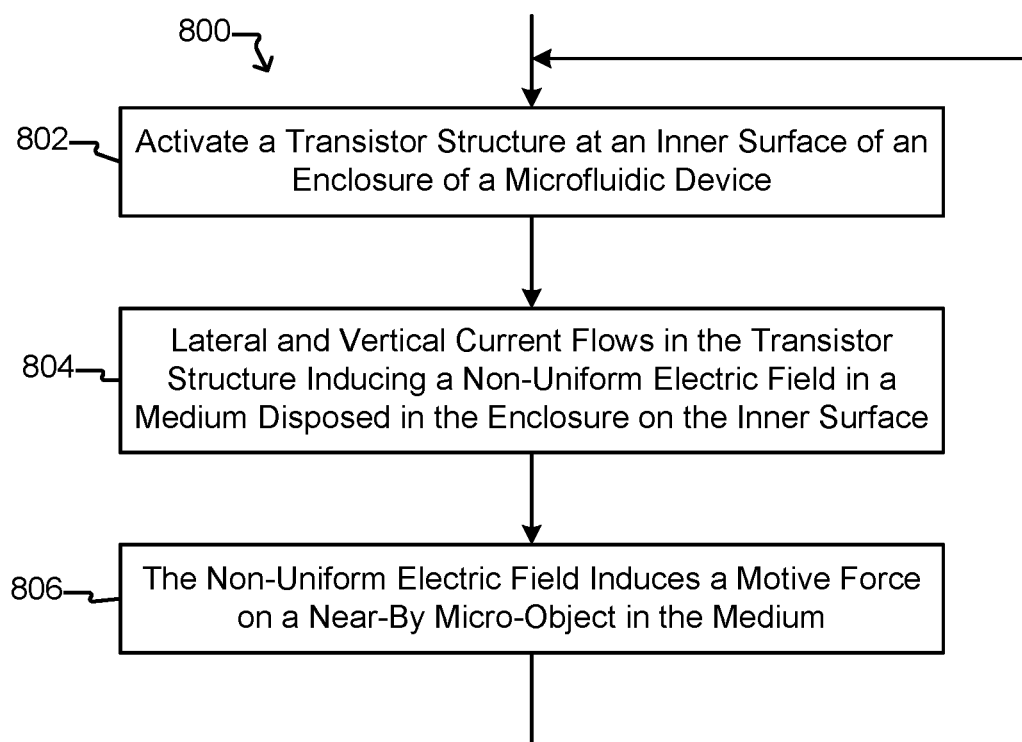
FIG. 8 is an example of a process for moving a micro-object as illustrated in FIG. 7.

FIG. 8 is an example of a process 800 for moving a micro-object (like 702) from one transistor structure 206 to another transistor structure 206. At step 802, a transistor structure is activated. For example, as illustrated in FIG. 7, transistor structure 206b can be activated (e.g., with a light beam 712) as discussed above. At step 804, the activated transistor structure (e.g., 206b in FIG. 7) induces lateral and vertical current flows (e.g., 722, 724 in FIG. 7), which creates a localized non-uniform electric field (e.g., 714) generally above the activated transistor structure. At step 806, the non-uniform electric field can induce an electrokinetic force (e.g., 706 in FIG. 7) on a nearby micro-object sufficient to move the micro-object 702 to or away from the force, also as discussed above. For example, as shown in FIG. 7, the force 706 can be a repelling force that pushes the micro-object 702 away from the activated transistor structure 206b to an adjacent unactivated transistor structure 206a.

As noted, the electrokinetic elements 114 in FIG. 1 can each be configured as a transistor structure 206. A micro-object (e.g., like 702 in FIG. 7) can be moved from electrokinetic element 114 to electrokinetic element 114 by repeating steps 802-806 to selectively activate and deactivate ones of the electrokinetic elements 114 in a pattern that moves the micro-object 702 in the enclosure 102 as desired. Although not shown, a pattern of electrokinetic elements 114 can be simultaneously activated to push the micro-object in a desired direction.

The micro-object 702 can be any type of inanimate or biological micro-object. For example, the micro-object 702 can be a microbead (e.g., a polystyrene bead or a glass bead, between about 1 μm and about 50 μm in diameter), a microrod, or the like. Examples of biological micro-objects include cells, such as SP2, HeLa, or jurkat cells, and the like, and embryos, sperm, oocytes, and the like.

In some embodiments, the fluidic medium 742 can have an electrical conductivity between about 10 mS/m and about 2 S/m. Examples of the fluidic medium include saline solutions (e.g., PBS and the like) and cell culture medium (e.g., RPMI DMEM, and the like). Process 800 can include maintaining the medium 742 at a temperature between about 5° C. and about 55° C.

Examples of biasing power that can be provided by the biasing power source 164 to the biasing electrodes 160, 162 include the following. Alternating current (AC) biasing power having a peak-to-peak voltage between about 1 Vppk and about 50 Vppk and/or a frequency between about 100 kHz and about 10 MHz. The biasing power can be a square waveform, a sine waveform, or a triangular waveform. The beam of light 712 can have an intensity between about 0.1 W/cm$^2$ and about 1000 W/cm$^2$.

Figure 9:
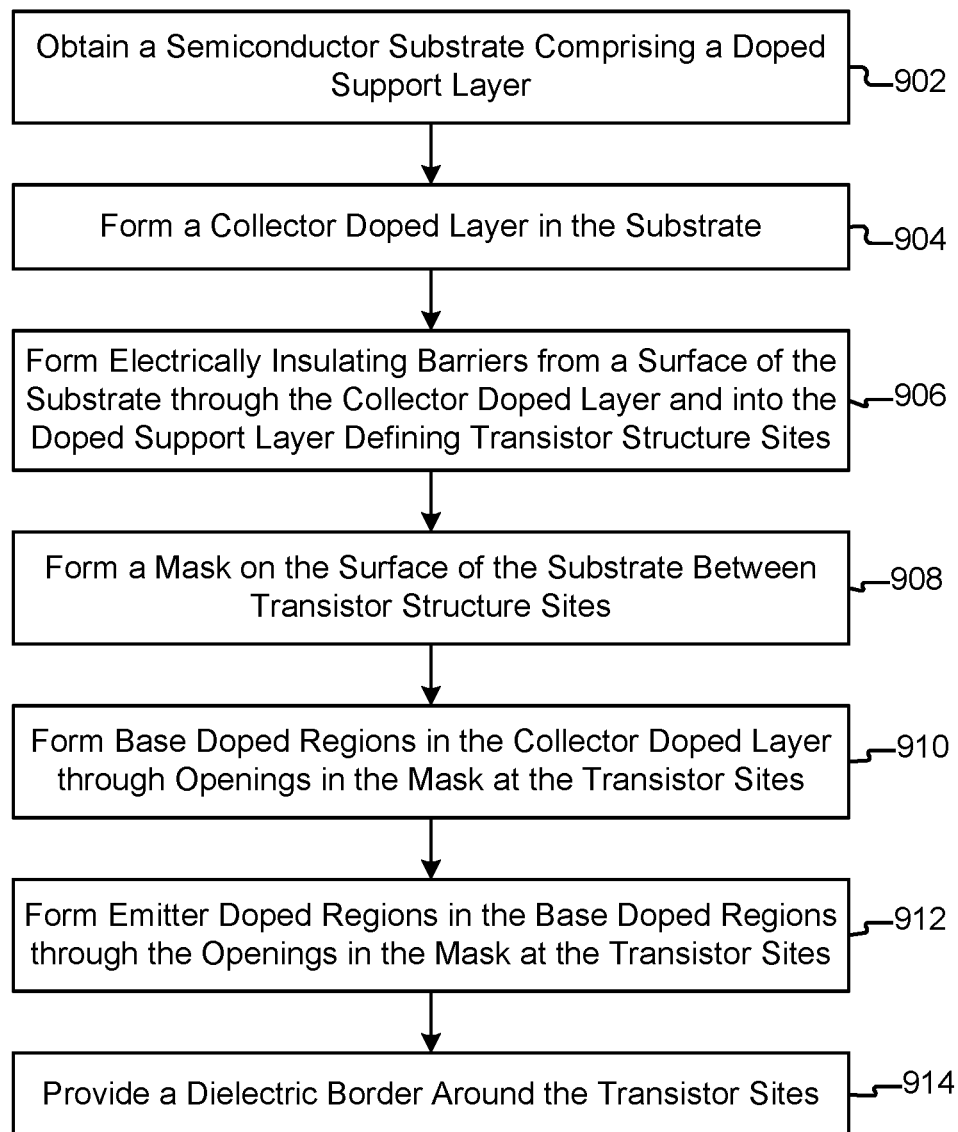
FIG. 9 is an example of a process for making the base of FIG. 2 according to some embodiments of the invention.

Process 900 of FIG. 9 illustrate an example of making the EK-configured base 200 illustrated in FIGS. 2-4. FIGS. 10-16 show examples of intermediate structures produced during the process 900.

Figure 10:
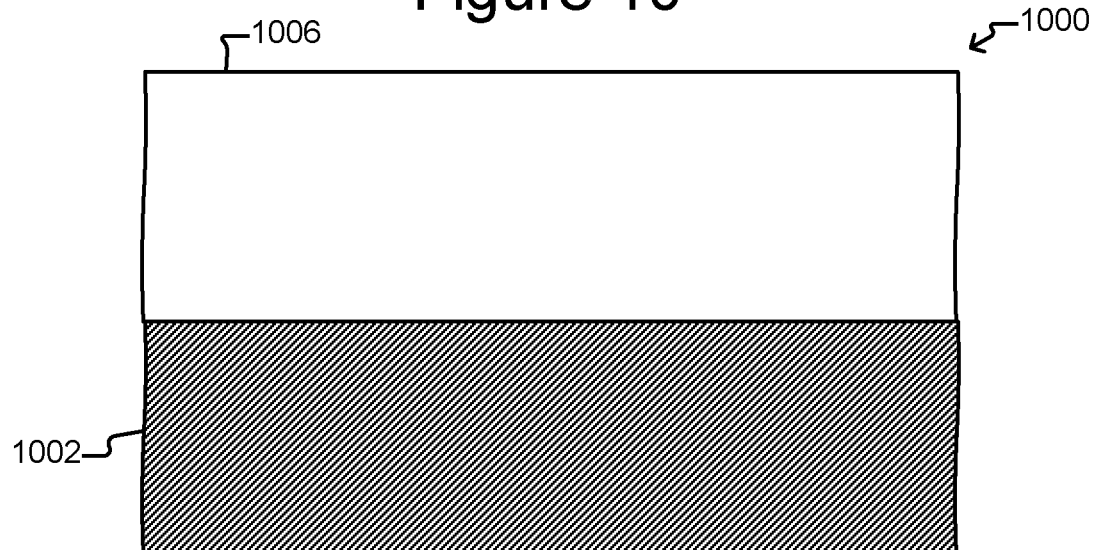
FIGS. 10, 11, 12A, 12B, 13A, 13B and 14 to 16 illustrate intermediate structures formed by the process of FIG. 9 according to some embodiments of the invention.

At step 902, the process 900 can obtain a semiconductor substrate comprising a doped support layer. FIG. 10 illustrates an example of a semiconductor substrate 1000 comprising a doped support layer 1002. An outer surface of the substrate 1000 is labeled 1006 in FIGS. 10-16. The semiconductor substrate 1000 can comprise any of the semiconductor materials identified above for the base 200. As will be seen, the doped support layer 1002 can be the basis for the support layer 204 in the base 200 and can thus be doped with any of the materials and in accordance with any of the parameters identified above for the support layer 204. Alternatively, the substrate 1000 can be obtained at step 902 without the doped support layer 1002, which can be formed during or after performing the process 900.

Figure 11:
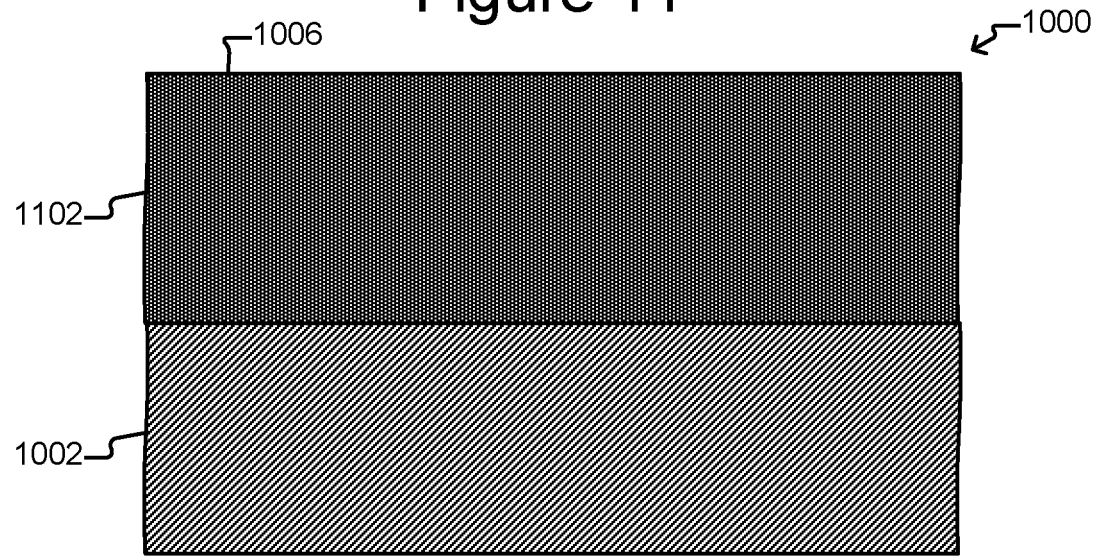

At step 904, the process 900 can form a collector doped layer in the substrate, which can be doped with a same type of dopant as the doped support layer. FIG. 11 shows an example of a doped collector layer 1102 formed in the substrate 1000 immediately adjacent to the doped support layer 1002. The collector doped layer 1102 can be doped with any of the materials and in accordance with any of the parameters identified above for the collector regions 220.

Figure 12A:
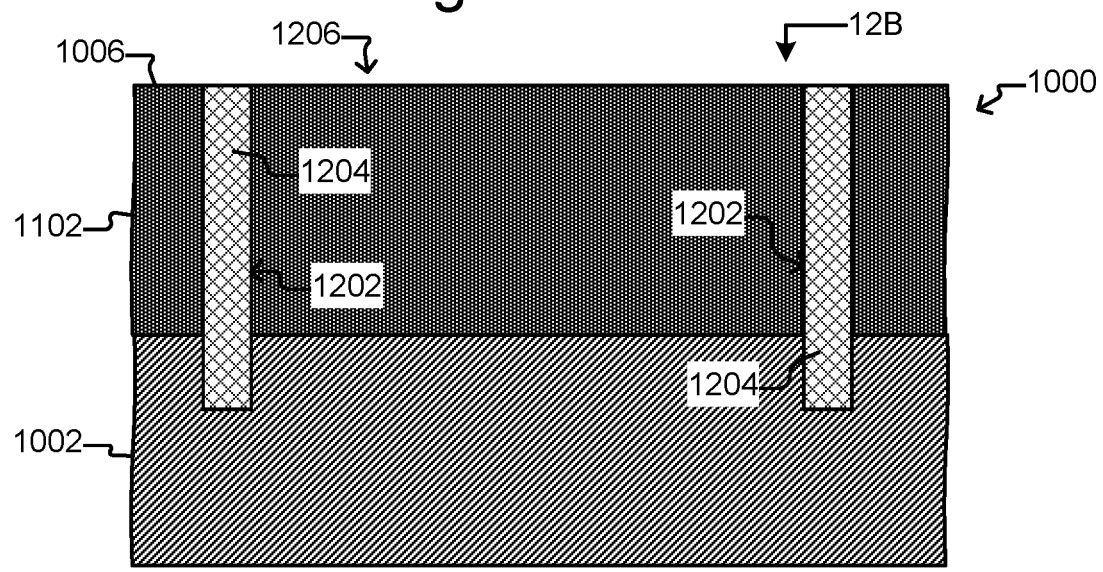
Figure 12B:
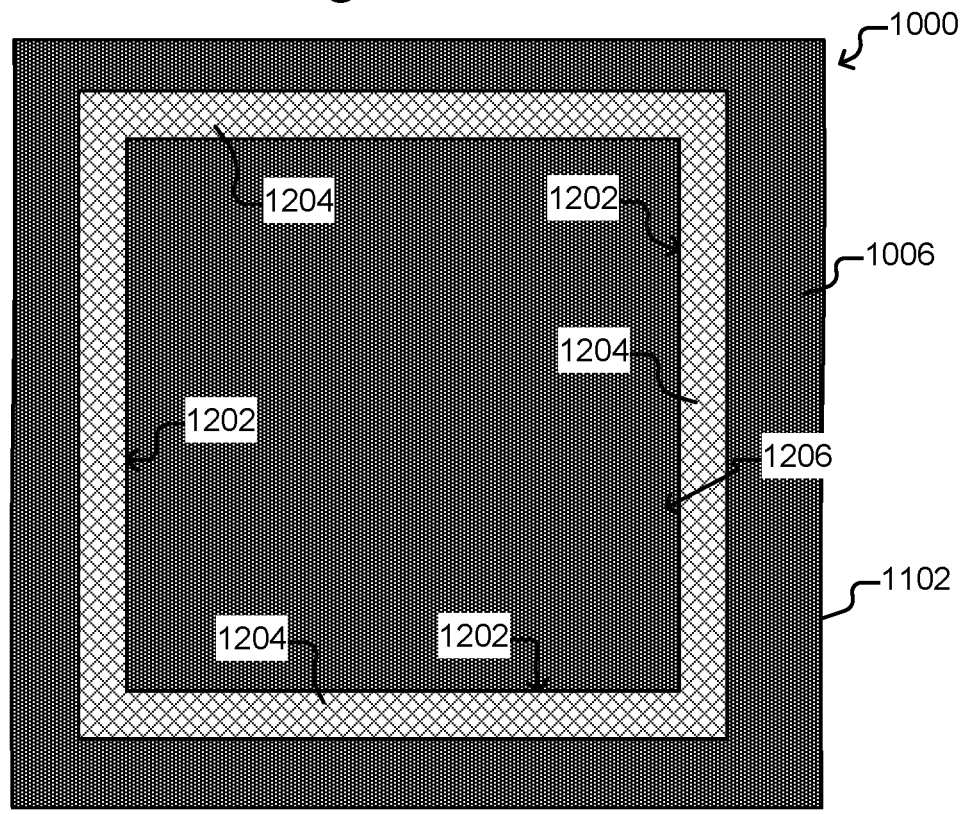

At step 906, the process 900 can form the electrically insulating barriers 212 (see FIGS. 2-4) in the substrate obtained at step 902. As illustrated in FIGS. 12A and 12B, trenches 1202 can be formed in the substrate 1000 from the outer surface 1006 through the collector doped layer 1102 and into the doped support layer 1002. Portions of the substrate 1000 enclosed by (e.g., surrounded by) a trench 1202 define a transistor structure site 1206 where a transistor structure 206 (see FIGS. 2-4) is to be formed. The trenches 1202 can thus be formed around locations in the substrate 1000 where transistor structures 206 are desired. The trenches 1202 can be filled with an electrically insulating material 1204 as also shown in FIGS. 12A and 12B.

Figure 13A:
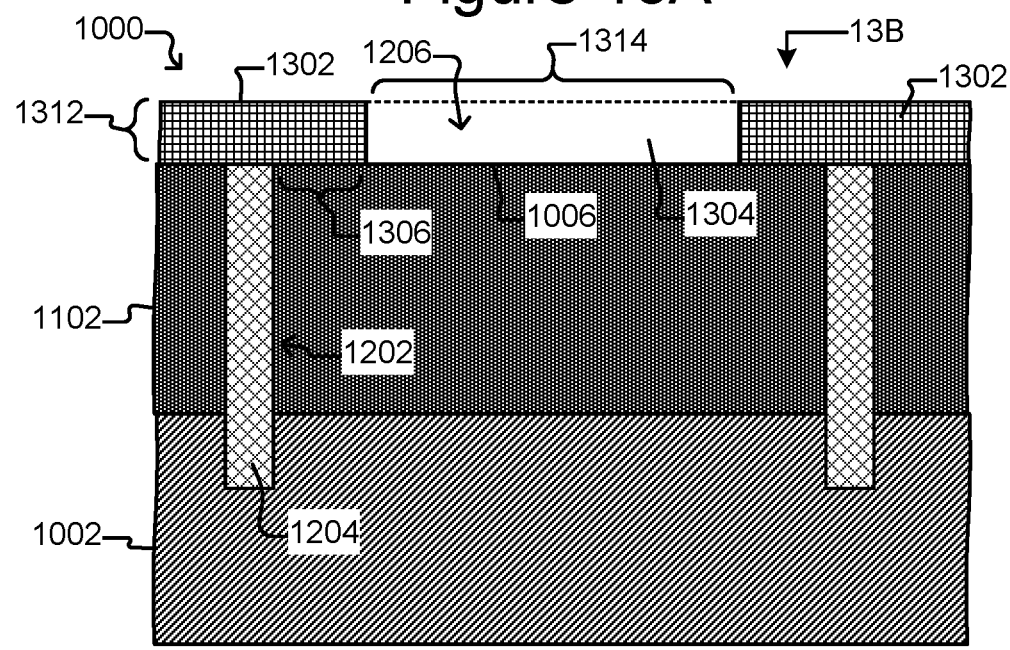
Figure 13B:
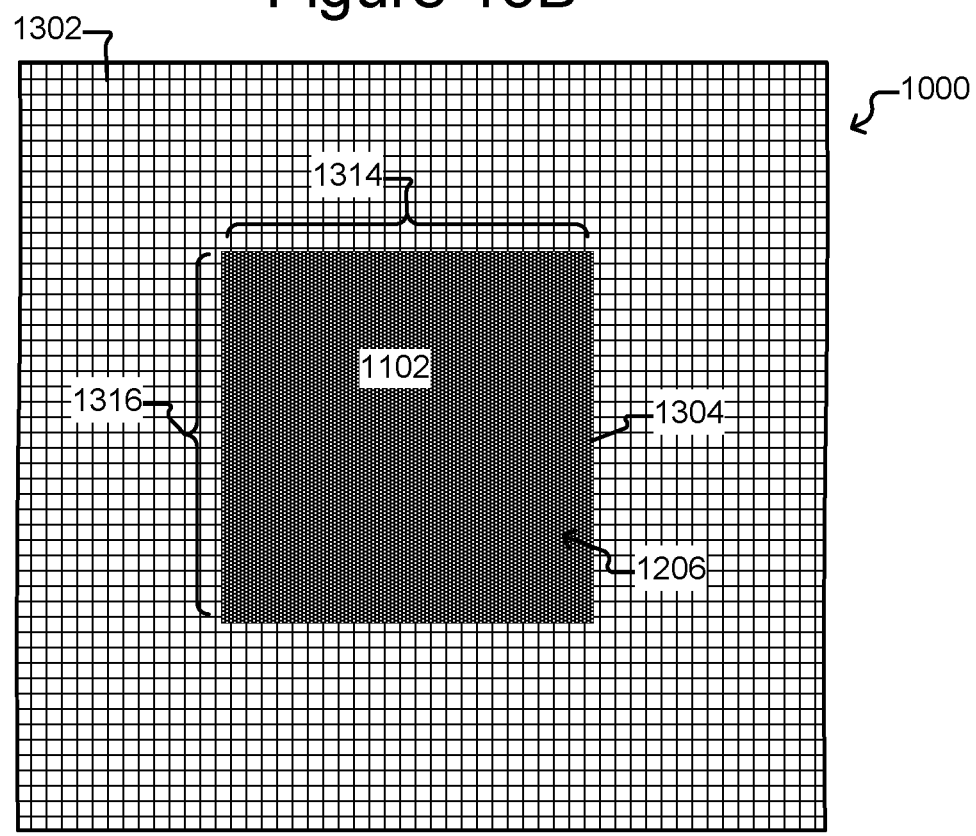

At step 908, the process 900 can form a mask on the substrate with openings at the transistor structure sites. FIGS. 13A and 13B illustrate an example in which a mask 1302 with opening 1304 is formed on the surface 1006 of the substrate 1000. As shown, the mask 1302 can have a thickness 1312, and each opening 1304 can be smaller than its corresponding transistor structure site 1206 so that the mask 1302 overlaps and extends from the trenches 1202 into the transistor structure site 1206 by a distance 1306. In FIGS. 13A and 13B, dimensions of the opening 1304 are labeled 1314, 1316.

As will be seen, the mask 1302 functions as a mask through which the base regions 230 and emitter regions 240 of the transistor structures 206 will be formed at each transistor site 1206. In some embodiments, the foregoing is the only function of the mask 1302, which is then removed after performing steps 910, 912. In other embodiments, the mask 1302 is also the border 210. In such embodiments, the mask 1302 can comprise any of the materials and can have any of the dimensions and parameters identified above for the border 210. The mask 1302 can be formed at step 908 with such dimensions and parameters. Alternatively, the mask 1302 can be formed at step 908 with different parameters and then modified after performing steps 910, 912 to have the desired dimensions and parameters of the border 210. For example, the mask 1302 can be formed at step 908 with a thickness 1312 conducive to performing steps 910, 912. After performing steps 910, 912, the thickness 1312 can be reduced to the desired thickness 402 (see FIG. 4) of the border 210.

Figure 14:
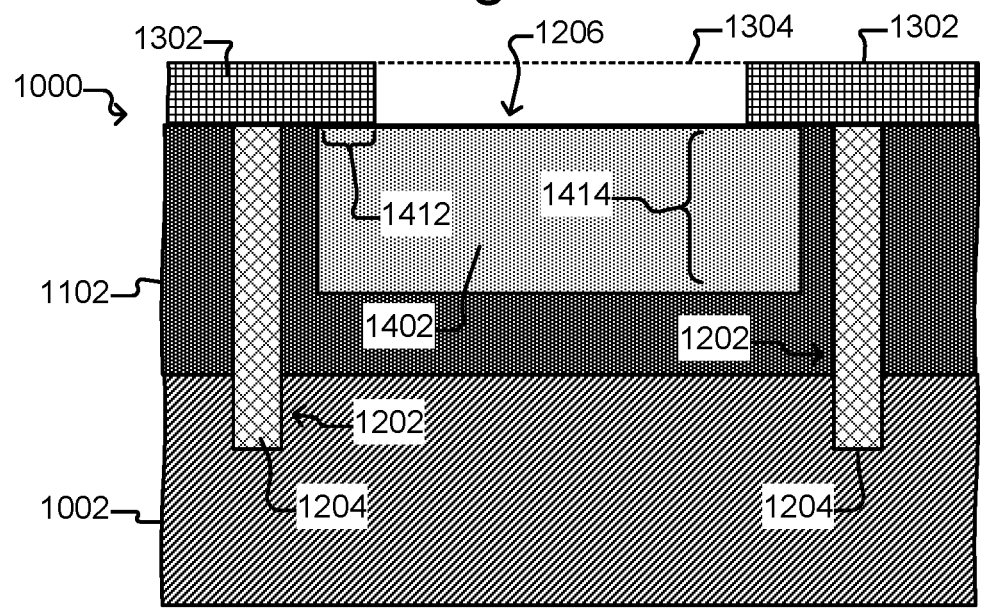

At step 910, the process 900 can form, through the openings in the mask at the transistor sites, base doped regions in the collector doped layer. FIG. 14 shows an example in which a base doped region 1402 is formed in the collector doped layer 1102 at a transistor site 1206. Parameters of the doping process can be controlled so that the depth 1414 of the base doped region 1402 from the surface 1006 of the substrate 1000 into the collector layer 1102 is the sum of the desired dimensions 430, 434 illustrated in FIG. 4. Similarly, parameters of the doping process can be controlled so that the under lap 1412 of the base doped region 1402 under the mask 1302 is the sum of the desired dimensions 410, 404 illustrated in FIG. 4. The doping at step 910 can be with any of the materials and in accordance with any of the parameters identified above for the base regions 230 of a transistor structure 206.

Figure 15:
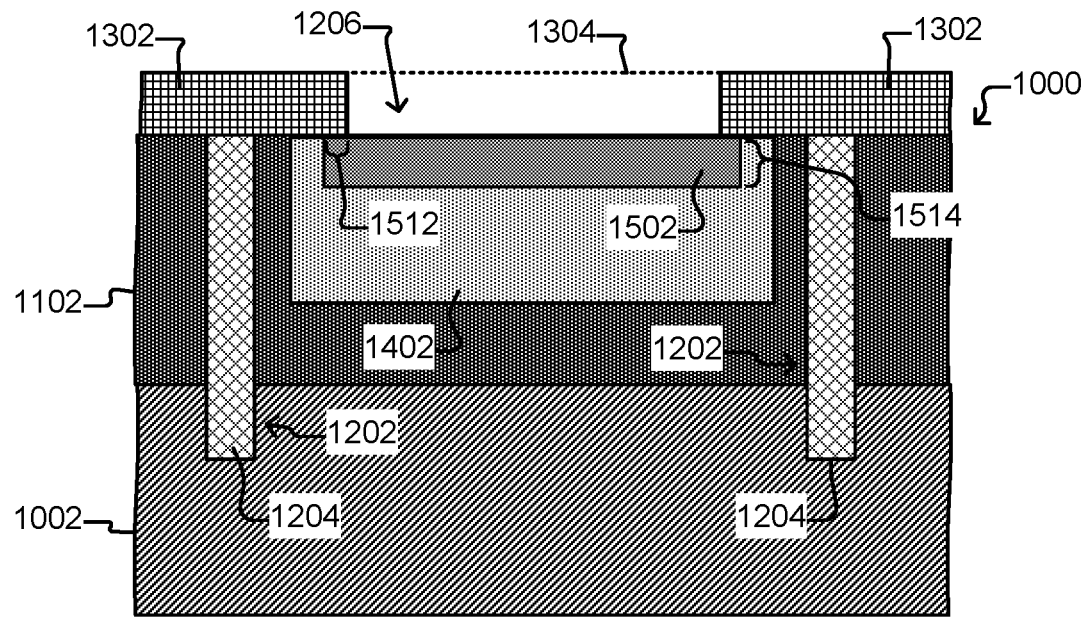

At step 912, the process 900 can form, through the openings in the mask at the transistor sites, emitter doped regions in the base doped regions formed at step 910. FIG. 15 illustrates an example in which an emitter doped region 1502 is formed in a base doped region 1402. Parameters of the doping process can be controlled so that the depth 1514 of the emitter doped region 1502 from the surface 1006 of the substrate 1000 into the base doped region 1402 is the desired dimension 434 illustrated in FIG. 4. Similarly, parameters of the doping process can be controlled so that the under lap 1512 of the emitter doped region 1502 under the mask 1302 is the desired dimension 404 illustrated in FIG. 4. The doping at step 912 can be with any of the materials and in accordance with any of the parameters identified above for the emitter regions 240 of a transistor structure 206.

At step 914, the border 210 can be provided. As noted, the mask 1302 can be utilized as the border 210, in which case the mask 1302 can be modified as desired and left in place to be the border 210. Otherwise, the mask 1302 can be removed as part of step 914 and the border 210 can be formed on the outer surface 1006 of the substrate.

Figure 16:
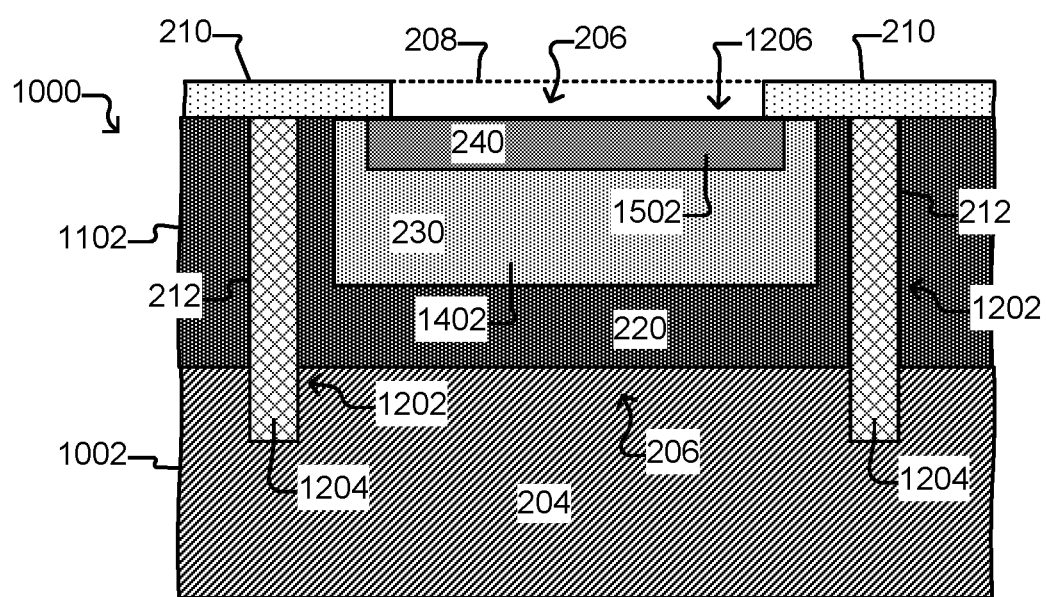

FIG. 16 illustrates a transistor structure 206 (see FIGS. 2-4) formed at one of the transistor sites 1206 as a result of the process 900. The filled trenches 1202 are barriers 212. The doped support layer 1002 is the support layer 204. The collector doped layer 1102 between filled trenches 1202 less the base doped region 1402 and the emitter doped region 1502 is the collector region 220. The base doped region 1402 less the emitter doped region 1502 is the base region 230, and the emitter doped region 1502 is the emitter region 240. FIGS. 10-16 illustrate only one of the many transistor sites 1206 at which transistor structures 206 can be formed in the substrate 1000 by the process 900. Thus, many such transistor structures 206 can be formed on the substrate 1000 by the process 900. For example, a plurality of transistor structures 206 can be formed adjacent to one another, e.g., in a rank and file array, on the substrate 1000 by the process 900.

Although specific embodiments and applications of the invention have been described in this specification, these embodiments and applications are exemplary only, and many variations are possible.

We claim:

1. A microfluidic device, comprising:
    an enclosure having a microfluidic structure and a base,
    wherein the base comprises a common electrical conductor,
    wherein the microfluidic structure and an outer surface of the base together define a flow path within the enclosure,
    wherein the base comprises an array of transistor structures, each said transistor structure in the array comprising a lateral bipolar transistor connecting a corresponding region of the outer surface of the base to the common conductor, and
    wherein each said transistor structure in the array further comprises a vertical bipolar transistor connecting the corresponding region of the outer surface of the base.

2. The microfluidic device of claim 1, wherein each said transistor structure in the array comprises a collector region, a base region, and an emitter region,
    wherein the base region surrounds the emitter region and comprises a lateral portion and a vertical portion,
    wherein the collector region surrounds the base region and comprises a lateral portion and a vertical portion, and
    wherein each said transistor structure in the array is physically separated from other transistor structures in the array.

3. The microfluidic device of claim 2, wherein the lateral portion of the base region has a lateral width that is between about 10 nm about 400 nm.

4. The microfluidic device of claim 1, wherein each said transistor structure in the array is physically separated from the other transistor structures in the array by a trench, further comprising an electrically insulative material disposed in the trenches.

5. The microfluidic device of claim 2, wherein the lateral portion of the base region has a lateral width that is between about 200 nm and about 300 nm.

6. The microfluidic device of claim 2, wherein the vertical portion of the base region has a vertical thickness equal to or greater than the lateral width of the lateral portion of the base region.

7. The microfluidic device of claim 6, wherein the vertical thickness of the vertical portion of the base region is about two to four times greater than the lateral width of the lateral portion the base region.

8. The microfluidic device of claim 2, wherein the base region comprises a p-type dopant, wherein the collector region comprises an n-type dopant, and wherein the emitter region comprises an n-type dopant.

9. The microfluidic device of claim 2, wherein the collector region has a resistivity that is between about 5 ohm-cm and about 10 ohm-cm.

10. The microfluidic device of claim 1, wherein the common conductor comprises an N+ semiconductor substrate upon which the array of transistor structures rests.

11. The microfluidic device of claim 10, wherein the N+ semiconductor substrate has a resistivity that is between about 0.025 ohm-cm and about 0.050 ohm-cm.

12. The microfluidic device of claim 2, wherein the lateral portion of the collector region has a lateral width that is between about 100 nm and about 1000 nm.

13. The microfluidic device of claim 2, wherein the lateral portion of the collector region has a vertical thickness equal to or greater than the lateral width of the lateral portion of the collector region.

14. The microfluidic device of claim 13, wherein the vertical thickness of the collector region is about two to ten times greater than the lateral width of the collector region.

15. The microfluidic device of claim 2, wherein the collector region has a resistivity that is between about 5 ohm-cm and about 10 ohm-cm.

16. The microfluidic device of claim 2, wherein a vertical thickness of the emitter region is between about 10 nm and about 500 nm.

17. The microfluidic device of claim 2, wherein a vertical thickness of the vertical portion of the base region is about six to twelve times greater than a vertical thickness of the emitter region.

18. The microfluidic device of claim 2, wherein a vertical thickness of the vertical portion of the collector region is about three to six times greater than a vertical thickness of the vertical portion of the base region.

19. The microfluidic device of claim 1, wherein a pitch of the transistor structures of the array is between about 1000 nm and about 20,000 nm.

20. The microfluidic device of claim 1, wherein a pitch of the transistor structures of the array is between about 8000 nm and about 12,000 nm.

21. The microfluidic device of claim 4, wherein a vertical depth of the trench is between about 2,000 nm and about 11,000 nm, and a lateral width of the trench is between about 100 nm and about 1000 nm.

22. The microfluidic device of claim 1, further comprising a dielectric border disposed on the outer surface of the base between adjacent pairs of the transistor structures of the array.

23. The microfluidic device of claim 1, wherein the microfluidic structure and the base together further define a holding pen, wherein the holding pen is connected to the flow path.

24. The microfluidic device of claim 1, wherein the flow path comprises a fluidic channel.

25. The microfluidic device of claim 1, wherein:
the transistor structures of the array connect different regions of the outer surface of the base to the common conductor, and
the regions of the outer surface of the base are disposed to contact directly fluidic medium in the flow path.

26. The microfluidic device of claim 25 further comprising a biasing electrode, wherein the flow path is disposed between the biasing electrode and the common electrical conductor of the base.

27. The microfluidic device of claim 1, wherein:
the base comprises a first section and a second section electrically insulated from the first section;
the array of transistor structures is a first array of said transistor structures in the first section, the base comprising a second array of said transistor structures in the second section;
the common conductor is a first common conductor that is common to the transistor structures of the first section but not the transistor structures of the second section; and
the base further comprises a second common conductor that is common to the transistor structures of the second section but not the transistor structures of the first section.

28. A microfluidic apparatus, comprising:
a first microfluidic device; and
a second microfluidic device,
wherein each of the first and second microfluidic devices is configured according to the microfluidic device of claim 1,
wherein the enclosure of the first microfluidic device is separate and distinct from the enclosure of the second microfluidic device, and
wherein the common electrical conductor of the first microfluidic device and the common electrical conductor of the second microfluidic device are electrically connected and compose an electrical conductor common to the first microfluidic device and the second microfluidic device.

29. A system which comprises the microfluidic device of claim 1 and further comprises control equipment for controlling operation of the microfluidic device.

30. The system of claim 29, wherein the control equipment is selected from the group comprising a flow controller for controlling a flow of fluidic medium in the flow path, an optical device for capturing images inside the enclosure, and a processor for controlling operation of the microfluidic device.

* * * * *